(12) United States Patent
Yoneda

(10) Patent No.: US 10,095,584 B2
(45) Date of Patent: Oct. 9, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 671 days.

(21) Appl. No.: 14/259,534

(22) Filed: Apr. 23, 2014

(65) Prior Publication Data

US 2014/0325171 A1 Oct. 30, 2014

(30) Foreign Application Priority Data

Apr. 26, 2013 (JP) .................................. 2013-093142

(51) Int. Cl.
- *G06F 9/30* (2018.01)
- *G06F 11/14* (2006.01)
- *G11C 14/00* (2006.01)

(52) U.S. Cl.
CPC ........ *G06F 11/141* (2013.01); *G06F 11/1441* (2013.01); *G11C 14/0063* (2013.01)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Corey S Faherty
(74) *Attorney, Agent, or Firm* — Fish & Richardson P.C.

(57) ABSTRACT

The amount of data to be backed up and recovered is reduced when supply of power to a semiconductor device is stopped and restarted. A backup need determination circuit provided in the semiconductor device reads the kind of instruction decoded by a decoder and determines whether data needs to be backed up from a volatile register to a nonvolatile register. With a structure according to one embodiment of the present invention, it is possible to select necessary data from data used for operation in a logic circuit before the power supply is stopped and after the power supply is restarted. Data that is necessary after the power supply is restarted can be backed up from the volatile register to the nonvolatile register before the power supply is stopped. Data that is unnecessary is not backed up from the volatile register to the nonvolatile register before the power supply is stopped.

17 Claims, 18 Drawing Sheets

(56) References Cited

U.S. PATENT DOCUMENTS

| | | | |
|---|---|---|---|
| 5,928,356 A * | 7/1999 | Golliver | G06F 9/30123 711/100 |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,924,276 B2 | 4/2011 | Tsuda et al. | |
| 7,986,546 B2 * | 7/2011 | Bertin | B82Y 10/00 365/151 |
| 8,046,615 B2 | 10/2011 | Taguchi et al. | |
| 8,275,930 B2 | 9/2012 | Inoue et al. | |
| 8,410,838 B2 | 4/2013 | Kato et al. | |
| 8,446,171 B2 | 5/2013 | Takahashi | |
| 8,575,985 B2 | 11/2013 | Ohmaru et al. | |
| 8,751,766 B2 | 6/2014 | Inoue et al. | |
| 9,135,988 B2 | 9/2015 | Nebashi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0055218 A1 | 3/2008 | Tsuda et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0201592 A1 | 8/2008 | Lawrence et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0089975 A1 | 4/2011 | Yamazaki et al. | |
| 2011/0090183 A1 | 4/2011 | Yamazaki et al. | |
| 2011/0101332 A1 | 5/2011 | Yamazaki et al. | |
| 2011/0101351 A1 | 5/2011 | Yamazaki | |
| 2011/0121878 A1 | 5/2011 | Kato et al. | |
| 2011/0148463 A1 | 6/2011 | Kato et al. | |
| 2011/0187410 A1 | 8/2011 | Kato et al. | |
| 2012/0230078 A1 | 9/2012 | Fujita | |
| 2012/0274356 A1 | 11/2012 | Takahashi | |
| 2012/0274378 A1 | 11/2012 | Fujita | |
| 2012/0274379 A1 | 11/2012 | Yoneda et al. | |
| 2012/0294060 A1 | 11/2012 | Ohshima et al. | |
| 2012/0294066 A1 | 11/2012 | Yoneda | |
| 2013/0134416 A1 | 5/2013 | Nishijima et al. | |
| 2013/0191673 A1 | 7/2013 | Koyama et al. | |
| 2013/0235689 A1 | 9/2013 | Koyama | |
| 2013/0262828 A1 | 10/2013 | Yoneda | |
| 2013/0262896 A1 | 10/2013 | Yoneda | |
| 2013/0270551 A1 | 10/2013 | Yoneda | |
| 2013/0285711 A1 | 10/2013 | Miyake | |
| 2013/0293266 A1 | 11/2013 | Takemura | |
| 2013/0297874 A1 | 11/2013 | Kurokawa | |
| 2013/0297952 A1 | 11/2013 | Miyake | |
| 2013/0315021 A1 | 11/2013 | Kondo et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| JP | 2003-086000 A | 3/2003 |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-204459 A | 9/2008 |
| JP | 2011-524555 | 9/2011 |
| WO | WO-2004/114391 | 12/2004 |
| WO | 2009/136442 A1 | 11/2009 |
| WO | WO-2010/064280 | 6/2010 |
| WO | WO-2013/035836 | 3/2013 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display On Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer". Adv. Mater. (Advanced Materials), 2006, vol. 18, No. 3. pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$-$Ga_2ZnO_4$-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Toshio Kamiya et al.; "Carrier Transport Properties and Electronic Structures of Amorphous Oxide Semiconductors: The present status"; Engineering Application of Solid State Physics; Kotai Butsuri, vol. 44, Issue 9; pp. 621-633; published in Japan in 2009.

Sanghun Jeon et al.; "180nm Gate Length Amorphous InGaZnO Thin Film Transistor for High Density Image Sensor Applications"; IEDM 10: Technical Digest of International Electron Devices Meeting; pp. 504-507; Dec. 6, 2010.

* cited by examiner

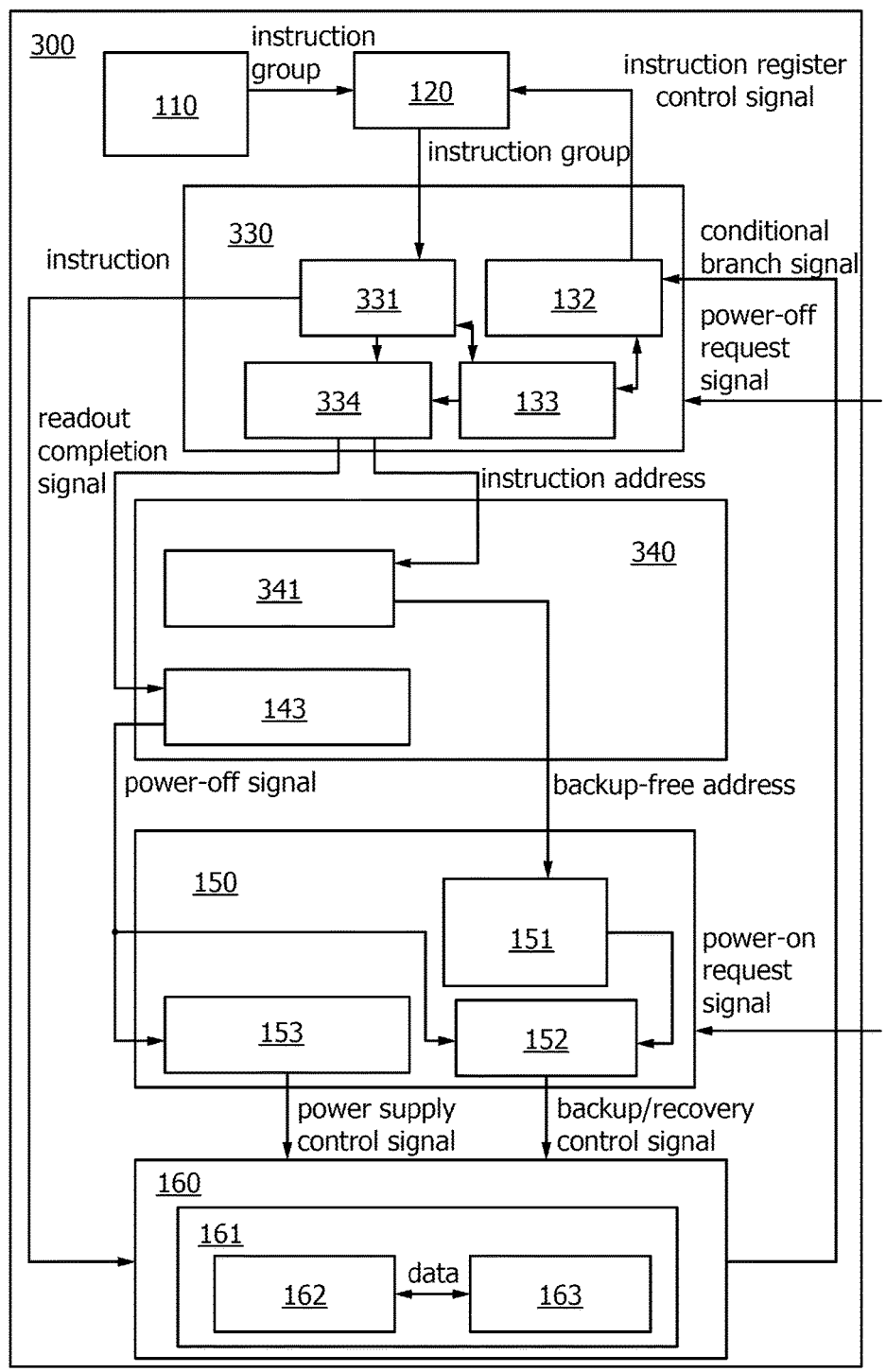

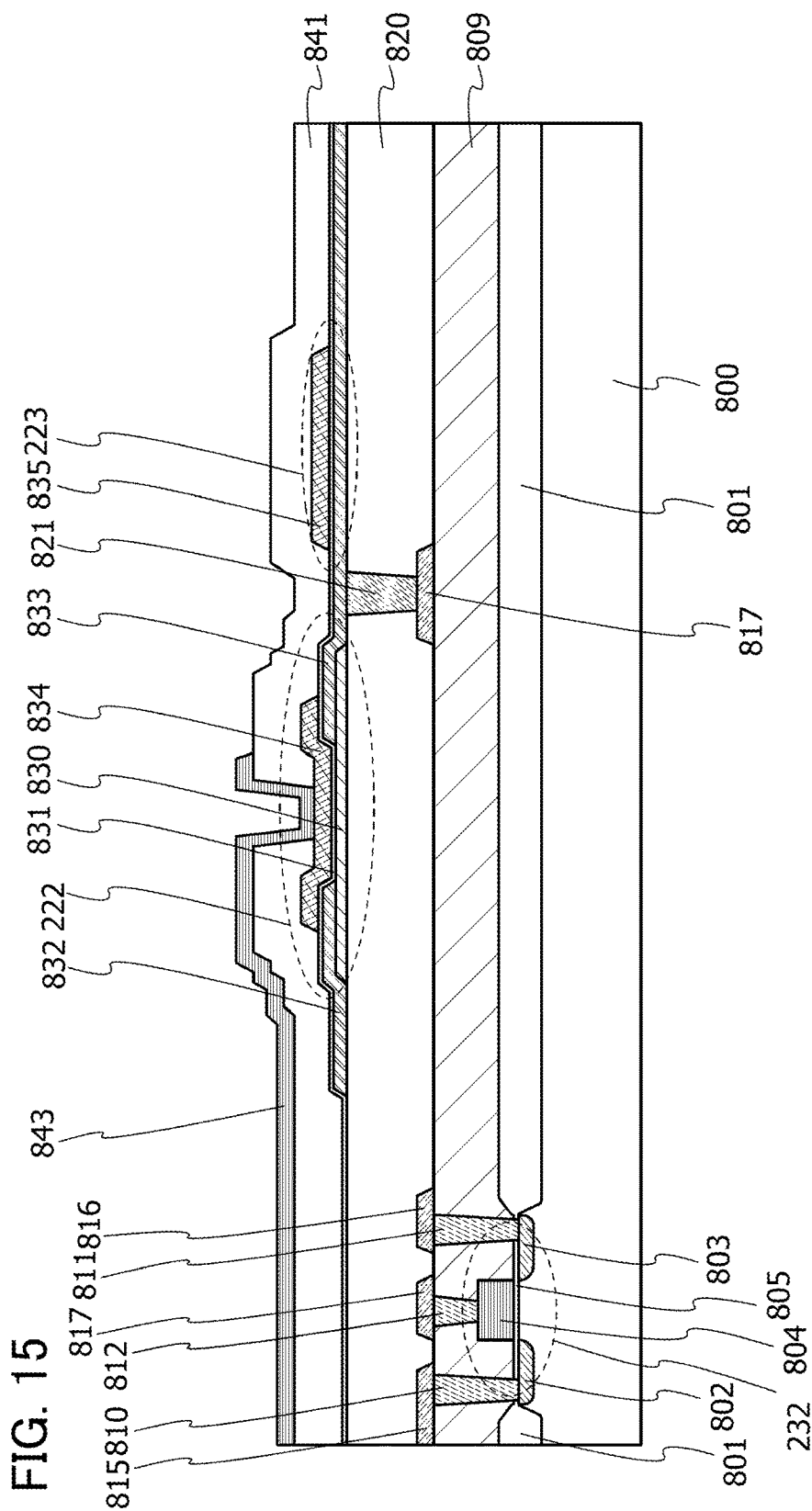

SEMICONDUCTOR DEVICE

BACKGROUND OF THE INVENTION

1. Field of the Invention

The present invention relates to a semiconductor device. In particular, the present invention relates to a semiconductor device capable of storing data even when power supply is stopped and a method for driving the semiconductor device.

2. Description of the Related Art

As for semiconductor devices such as micro processing units (MPU), improvement of operating frequency and downsizing of elements have been researched and developed to improve performance and reduce power consumption. On the other hand, the power consumption of semiconductor devices due to leakage power or the like caused by downsizing of elements is increased.

In recent years, to solve the problem of increased power consumption, a technique for drastically reducing power consumption has attracted attention in which a volatile register and a nonvolatile register are combined in a semiconductor device, data is backed up and recovered between the volatile register and the nonvolatile register, and supply of power to the semiconductor device is stopped and restarted actively (see Patent Document 1).

REFERENCE

Patent Document 1: PCT international Publication No. 2009/136442
Patent Document 2: Japanese Published Patent Application No. 2008-204459

SUMMARY OF THE INVENTION

In a structure in which data is backed up and recovered between a volatile register and a nonvolatile register, when the amount of data to be backed up increases, power for data backup and data recovery and the time to back up and recover data increase.

In view of the problem, an object of one embodiment of the present invention is to reduce the amount of data to be backed up and recovered when supply of power to a semiconductor device in which data is backed up and recovered between a volatile register and a nonvolatile register is stopped and restarted.

In one embodiment of the present invention, a backup need determination circuit is provided in the semiconductor device. The backup need determination circuit reads the kind of instruction decoded by a decoder and determines whether data needs to be backed up from the volatile register to the nonvolatile register.

With a structure according to one embodiment of the present invention, it is possible to select necessary data from data used for operation in a logic circuit before the power supply is stopped and after the power supply is restarted. Data that is necessary after the power supply is restarted can be backed up from the volatile register to the nonvolatile register before the power supply is stopped. Data that is unnecessary after the power supply is restarted can be discarded without being backed up from the volatile register to the nonvolatile register before the power supply is stopped.

One embodiment of the present invention is a semiconductor device that includes a logic circuit, an instruction decoder, a backup need determination circuit, and a power gating control circuit. The logic circuit includes a plurality of registers each including a volatile register and a nonvolatile register. The instruction decoder receives an instruction group including a plurality of instructions stored in an instruction cache through an instruction register. The backup need determination circuit determines a data backup-free address that does not need data backup from the volatile register to the nonvolatile register in accordance with an opcode and an operand of an unexecuted instruction in the logic circuit among the plurality of instructions. The power gating control circuit controls data backup and power supply in the logic circuit in accordance with the backup-free address.

In the semiconductor device according to one embodiment of the present invention, the instruction decoder preferably includes a decoder sequentially decoding the plurality of received instructions, an instruction counter incrementing a count value each time the decoded instruction is transmitted to the logic circuit, and an instruction readout circuit transmitting the opcode and the operand transmitted from the decoder to the backup need determination circuit in accordance with the count value of the instruction counter at the time when a power-off request signal is input to the instruction decoder.

In the semiconductor device according to one embodiment of the present invention, the backup need determination circuit preferably includes a backup-free address determination circuit and an address determination circuit determining whether an address of the operand is a destination address or a source address in accordance with each opcode. The backup-free address determination circuit includes a comparison circuit comparing the destination address with the source address and transmits the destination address that does not agree with the source address in the comparison circuit to the power gating control circuit as the backup-free address.

In the semiconductor device according to one embodiment of the present invention, the power gating control circuit preferably includes a backup-free address register storing the backup-free address and a backup/recovery control circuit generating a backup/recovery control signal in accordance with the backup-free address.

One embodiment of the present invention is a semiconductor device that includes a logic circuit, an instruction decoder, a backup need determination circuit, and a power gating control circuit. The logic circuit includes a plurality of registers each including a volatile register and a nonvolatile register. The instruction decoder receives an instruction group including a plurality of instructions stored in an instruction cache through an instruction register. The backup need determination circuit determines a data backup-free address that does not need data backup from the volatile register to the nonvolatile register in accordance with an instruction address of an unexecuted instruction among the plurality of instructions. The power gating control circuit controls data backup and power supply in the logic circuit in accordance with the backup-free address.

In the semiconductor device according to one embodiment of the present invention, the instruction decoder preferably includes a decoder sequentially decoding the plurality of received instructions, an instruction counter incrementing a count value each time the decoded instruction is transmitted to the logic circuit, and an instruction address readout circuit transmitting the instruction address transmitted from the decoder to the backup need determination circuit in accordance with the count value of the instruction counter at the time when a power-off request signal is input to the instruction decoder.

In the semiconductor device according to one embodiment of the present invention, the backup need determination circuit preferably includes a backup-free address determination circuit transmitting an address corresponding to the instruction address to the power gating control circuit as a backup-free address.

In the semiconductor device according to one embodiment of the present invention, a memory element included in the nonvolatile register preferably stores the data by holding electric charge using a transistor including an oxide semiconductor layer.

According to one embodiment of the present invention, it is possible to reduce the amount of data to be backed up and recovered when supply of power to a semiconductor device in which data is backed up and recovered between a volatile register and a nonvolatile register is stopped and restarted. Thus, power for data backup and data recovery and the time to back up and recover data can be reduced.

BRIEF DESCRIPTION OF THE DRAWINGS

In the accompanying drawings:

FIG. 11 is a flow chart illustrating a semiconductor device structure;

FIG. 15 is a cross-sectional view of a semiconductor device;

DETAILED DESCRIPTION OF THE INVENTION

Figure 1:
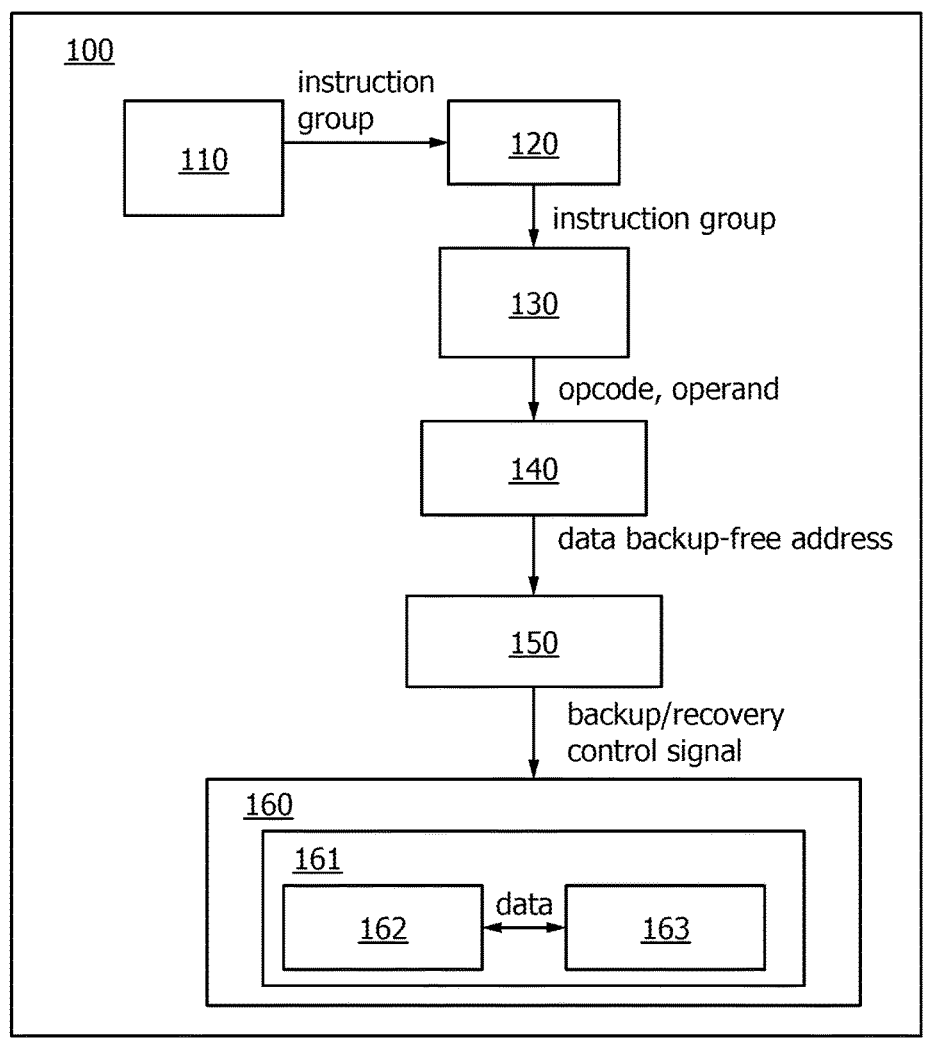
FIG. 1 is a block diagram illustrating a semiconductor device structure.

Embodiments will be described below with reference to the drawings. Note that the embodiments can be implemented in various different ways and it will be readily appreciated by those skilled in the art that modes and details of the present invention can be modified in various ways without departing from the spirit and scope of the present invention. The present invention therefore should not be construed as being limited to the following description of the embodiments. Note that in structures of the invention described below, reference numerals denoting the same portions are used in common in different drawings.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate (a gate terminal or a gate electrode), a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a region that functions as a source or a region that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first," "second," and "third" are used to avoid confusion among components, and thus do not limit the number of the components.

Note that in this specification, the expression "A and B are connected" means the case where "A and B are electrically connected" in addition to the case where "A and B are directly connected." Here, the expression "A and B are electrically connected" means the case where electric signals can be transmitted and received between A and B when an object having any electric action exists between A and B.

Note that in this specification, terms for describing arrangement, such as "over" and "under," are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

Note that the positional relationships of circuit blocks in diagrams are specified for description, and even in the case where different circuit blocks have different functions in the diagrams, the different circuit blocks might be provided in an actual circuit block so that different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

In this specification, voltage refers to a difference between a given potential and a reference potential (e.g., a ground potential) in many cases. Thus, voltage, a potential, and a potential difference can also be referred to as a potential, voltage, and a voltage difference, respectively. Note that voltage refers to a difference between potentials of two points, and a potential refers to electrostatic energy (electric potential energy) of a unit electric charge at a given point in an electrostatic field.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification, trigonal and rhombohedral crystal systems are included in a hexagonal crystal system.

Embodiment 1

In this embodiment, structures and functions of blocks included in a semiconductor device according to one embodiment of the disclosed invention are described with reference to FIG. 1, FIG. 2, FIG. 3, FIG. 4, FIG. 5, FIG. 6, FIG. 7, FIGS. 8A and 8B, FIG. 9, and FIG. 10.

Note that a semiconductor device refers to a device including a semiconductor element.

FIG. 1 is a block diagram of a semiconductor device. A semiconductor device 100 in FIG. 1 includes an instruction cache 110, an instruction register 120, an instruction decoder 130, a backup need determination circuit 140, a power gating control circuit 150, and a logic circuit 160. The logic circuit 160 includes a register 161 in which a nonvolatile register and a volatile register are combined. The register 161 includes a volatile register 162 and a nonvolatile register 163.

The instruction cache 110 has a function of temporarily storing an instruction group transmitted from an external storage device such as a DRAM and a function of transmitting the stored instruction group under the control of the instruction register 120. The instruction cache 110 included in the semiconductor device 100 can make the instruction decoder 130 receive a desired instruction group at high speed under the control of the instruction register 120 without directly reading an instruction group executed by specifying an address of the external storage device to the instruction decoder 130 compared to the case where the instruction group is directly read from the external storage device.

Note that for easy understanding, the instruction cache 110 is provided in the semiconductor device 100; however, the instruction cache 110 may be provided outside the semiconductor device 100.

Note that the instruction group means a group of instructions read from the external storage device to the instruction cache 110 using a program counter. For example, a program for carrying out addition of "A+B=C" executes the following plurality of instructions: an instruction 1) to read A to a register, an instruction 2) to read B to the register, and an instruction 3) to write C obtained by addition of A to B to the register. In the following description, these plurality of instructions are referred to as an instruction group.

The instruction register 120 has a function of temporarily storing an instruction group stored in the instruction cache 110. The instruction register 120 included in the semiconductor device 100 can make the instruction decoder 130 receive a desired instruction group under the control of the instruction decoder 130.

The instruction decoder 130 has a function of transmitting an instruction obtained by decoding a received instruction group to a logic circuit and has a function of transmitting an operand and an opcode of an unexecuted instruction in the received instruction group to the backup need determination circuit 140. The instruction decoder 130 included in the semiconductor device 100 can transmit an operand and an opcode for determining whether data needs to be backed up when power supply is stopped to the backup need determination circuit 140.

The backup need determination circuit 140 has a function of determining a backup-free address for determining whether data needs to be backed up when power supply is stopped in accordance with an operand and an opcode transmitted from the instruction decoder 130. The backup need determination circuit 140 included in the semiconductor device 100 can transmit a backup-free address to the power gating control circuit 150.

The power gating control circuit 150 has a function of generating a backup/recovery control signal for controlling data backup from the volatile register 162 to the nonvolatile register 163 included in the register 161 of the logic circuit 160 in accordance with a backup-free address transmitted from the backup need determination circuit 140 and for selecting data recovery from the nonvolatile register 163 to the volatile register 162. The power gating control circuit 150 included in the semiconductor device 100 can transmit a backup/recovery control signal to the logic circuit 160.

The logic circuit 160 has a function of controlling data backup/recovery between the volatile register 162 and the nonvolatile register 163 in accordance with a backup/recovery control signal.

The volatile register 162 and the nonvolatile register 163 store data used for data processing. The volatile register 162 in the register 161 stores data in a period during which power is supplied, and the nonvolatile register 163 in the register 161 stores data in a period during which the power supply is stopped.

The volatile register 162 is preferably formed using an element stacked below an element used for the nonvolatile register 163. Specifically, the volatile register 162 can be formed using a silicon-based semiconductor element (e.g., a capacitor or a transistor).

The nonvolatile register 163 is preferably formed using an element including a nonvolatile memory element stacked on the element used for the volatile register 162. Specifically, as the nonvolatile memory element that can be used for the nonvolatile register 163, a ferroelectric random access memory (FeRAM), a magnetoresistive random access memory (MRAM), a phase-change random access memory (PRAM), a resistive random access memory (ReRAM) using colossal electro-resistance, or a nonvolatile memory element using a transistor including an oxide semiconductor layer can be used.

In the semiconductor device 100, the backup need determination circuit 140 is provided. The backup need determination circuit 140 reads the kind of instruction (opcode) decoded by the instruction decoder 130 and determines whether data needs to be backed up from the volatile register 162 to the nonvolatile register 163.

With the structure of the semiconductor device 100, it is possible to select necessary data from data used for operation in the logic circuit 160 before the power supply is stopped and after the power supply is restarted. Data that is necessary after the power supply is restarted can be backed up from the volatile register 162 to the nonvolatile register 163 before the power supply is stopped. Data that is unnecessary after the power supply is restarted can be discarded without being backed up from the volatile register 162 to the nonvolatile register 163 before the power supply is stopped.

Consequently, it is possible to reduce the amount of data to be backed up from the volatile register 162 to the nonvolatile register 163 and recovered from the nonvolatile register 163 to the volatile register 162 when supply of power to the semiconductor device is stopped and restarted. Thus, power for data backup and data recovery and the time to back up and recover data can be reduced.

Figure 2:
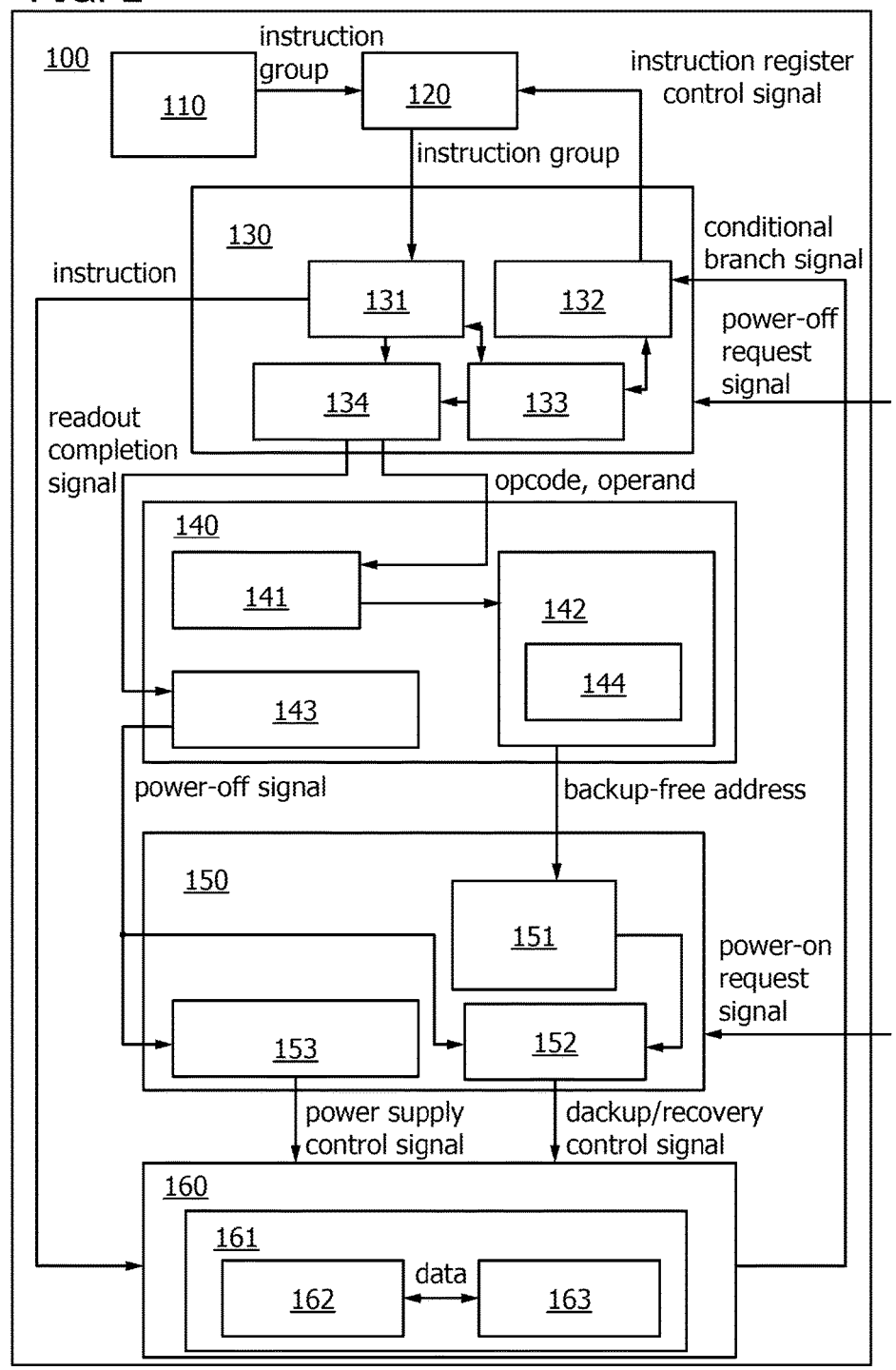
FIG. 2 is a block diagram illustrating a semiconductor device structure.

Next, a detailed block diagram of the semiconductor device 100 in FIG. 1 is illustrated in FIG. 2. Furthermore, FIG. 3, FIG. 4, FIG. 5, FIG. 6, and FIG. 7 illustrate specific examples of the operation of the block diagram in FIG. 2 and data determination in the operation.

In FIG. 2, a decoder 131, an instruction register control circuit 132, an instruction counter 133, and an instruction readout circuit 134 are provided in the instruction decoder 130 in the block diagram in FIG. 1.

In FIG. 2, an address determination circuit 141, a backup-free address determination circuit 142, and a power-off request circuit 143 are provided in the backup need determination circuit 140 in the block diagram in FIG. 1. Furthermore, the backup-free address determination circuit 142 includes a comparison circuit 144.

In FIG. 2, a backup-free address register 151, a backup/recovery control circuit 152, and a power supply control circuit 153 are provided in the power gating control circuit 150 in the block diagram in FIG. 1.

The decoder 131 sequentially decodes instructions of a received instruction group. Decoded instructions are transmitted to the logic circuit 160. Furthermore, the decoder 131 transmits an operand and an opcode to the instruction readout circuit 134 in accordance with a count value of the instruction counter 133. Furthermore, the decoder 131 increments the count value of the instruction counter 133 each time the decoder 131 decodes the instruction of the instruction group and transmits the decoded instruction to the logic circuit 160.

The instruction register control circuit 132 transmits an instruction register control signal to the instruction register 120. Furthermore, the instruction register control circuit 132 resets the count value of the instruction counter 133 after a conditional branch signal is input to the instruction register control circuit 132. At timing of resetting the instruction counter 133, the instruction register control circuit 132 transmits an instruction register control signal for receiving another instruction group to the instruction decoder 130.

Note that the instruction register control signal means a signal for making the instruction register 120 temporarily storing an instruction group transmitted from the instruction cache 110 transmit the instruction group to the instruction decoder 130.

Note that the conditional branch signal means a signal generated by an instruction executed in the logic circuit 160. When the conditional branch signal is generated, the program counter is rewritten. It is necessary to rewrite the instruction group stored in the instruction register.

The count value of the instruction counter 133 is incremented by the decoder 131 each time the decoded instruction is transmitted to the logic circuit 160. Furthermore, the instruction counter 133 transmits the count value at the time when a power-off request signal is input to the instruction decoder 130 to the instruction readout circuit 134. The count value of the instruction counter 133 is an indicator of the ordinal position of an instruction executed in an instruction group decoded by the decoder 131.

The count value of the instruction counter 133 is reset by transmitting all the instructions of the instruction group to the logic circuit 160. Note that at timing of resetting the instruction counter 133, the instruction register control circuit 132 transmits an instruction register control signal for receiving another instruction group to the instruction decoder 130.

Note that the power-off request signal is, for example, a signal input from the outside of the semiconductor device 100 in the case where the semiconductor device 100 does not need to operate for a certain period. Whether the semiconductor device 100 needs to operate may be determined using a timer. For example, in the case where transmission and reception of signals to and from the semiconductor device 100 are not detected for a certain period that is measured by the timer, a power-off request signal may be transmitted to the semiconductor device 100.

In the case where a power-off request signal is input to the instruction decoder 130, the instruction readout circuit 134 transmits an operand and an opcode obtained by decoding an unexecuted instruction by the decoder 131 to the address determination circuit 141 in accordance with the count value of the instruction counter 133. Furthermore, the instruction readout circuit 134 transmits an instruction readout completion signal to the power-off request circuit 143 after transmission of the operand and the opcode to the address determination circuit 141 is completed. An instruction after an instruction indicated by the count value corresponds to an unexecuted instruction in the logic circuit 160.

Note that the instruction readout completion signal means a signal for notifying the power-off request circuit 143 of completion of transmission of the operand and the opcode from the instruction readout circuit 134 to the address determination circuit 141. By transmitting the instruction readout completion signal from the instruction readout circuit 134 to the power-off request circuit 143, the semiconductor device 100 can perform a power-off sequence without malfunction.

The instruction decoder 130 can transmit an instruction obtained by decoding a received instruction group to the logic circuit. In addition, the instruction decoder 130 can transmit an instruction register control signal to the instruction register 120 in accordance with a conditional branch signal. Furthermore, the instruction decoder 130 can transmit an operand and an opcode of an instruction that is not transmitted to the logic circuit 160 in the received instruction group to the backup need determination circuit 140 in accordance with a power-off request signal. Furthermore, the instruction decoder 130 can transmit an instruction readout completion signal for notifying completion of transmission of the operand and the opcode of the instruction that is not transmitted to the logic circuit 160 to the backup need determination circuit 140.

The address determination circuit 141 determines whether an address of an operand transmitted from the instruction readout circuit 134 is a destination address or a source address in accordance with each opcode transmitted from the instruction readout circuit 134. For example, in the case of an instruction to increment and store an operand 1 in an operand 2, the opcode is "increment (INC)," the operand 1 is a source address, and the operand 2 is a destination address.

The backup-free address determination circuit 142 compares destination addresses and source addresses of instructions determined by the address determination circuit 141 and specifically determines which address of a register does not need data backup. Specifically, the backup-free address determination circuit 142 determines whether data of a destination address is rewritten by an instruction executed after data backup and recovery. The backup-free address determination circuit 142 makes this determination by comparing a destination address obtained in the address determination circuit 141 with a source address. An address of the register that does not need data backup is transmitted to the backup-free address register 151 as a backup-free address.

Note that the backup-free address is, for example, an address of the register 161 that does not need data backup from the volatile register 162 to the nonvolatile register 163 in the logic circuit 160. Alternatively, the backup-free address is, for example, an address of the register 161 that does not need data recovery from the nonvolatile register 163 to the volatile register 162 in the logic circuit 160.

The power-off request circuit 143 generates a power-off signal for stopping supply of power to the backup/recovery control circuit 152 and the power supply control circuit 153 in accordance with an instruction readout completion signal transmitted from the instruction readout circuit 134. Note that a power-off signal transmitted from the power-off request circuit 143 is preferably generated after a backup-free address is transmitted from the backup-free address determination circuit 142 to the backup-free address register 151.

Note that the power-off signal is, for example, a signal for controlling the power supply control circuit 153 that stops supply of power to the logic circuit 160.

The comparison circuit 144 compares a destination address and a source address of each instruction determined by the address determination circuit 141 in the backup-free address determination circuit 142.

The specific operation of the comparison circuit 144 is described. The total number of instructions of an instruction group received by the instruction decoder 130 is n (n is a natural number of 2 or more). In the case where the instruction decoder 130 receives a power-off request signal and the count value of the instruction counter 133 at this time is m (m is a natural number of 1 or more and n or less), operands and opcodes of an m-th instruction and instructions after the m-th instruction are transmitted from the instruction readout circuit 134. In other words, operands and an opcodes of m-th to n-th instructions are transmitted from the instruction readout circuit 134 to the comparison circuit 144 in the backup-free address determination circuit 142 through the address determination circuit 141. In comparison of a destination address and a source address of each instruction in the comparison circuit 144, for example, the comparison circuit 144 compares the destination address of the n-th instruction with m-th to n-th source addresses to determine whether these addresses agree with each other.

In this determination, a destination address that agrees with at least one source address is data used for executing an instruction after power supply is restarted; thus, the data is backed up. In addition, in this determination, a destination address that agrees with none of source addresses is data that is unnecessary for executing an instruction after the power supply is restarted; thus, the data is not backed up but discarded. The destination address whose data is not backed up is transmitted to the backup-free address register 151 as a backup-free address.

The backup need determination circuit 140 can determine a backup-free address for determining whether data needs to be backed up when power supply is stopped in accordance with an operand and an opcode transmitted from the instruction readout circuit 134. In addition, the backup need determination circuit 140 can generate a power-off signal for requesting the power gating control circuit 150 to stop power supply in accordance with an instruction readout completion signal transmitted from the instruction readout circuit 134.

The backup-free address register 151 stores a backup-free address. The backup-free address is used for specifying an address of a register that does not need data backup and for specifying an address of a register that needs data recovery. The backup-free address of the backup-free address register 151 is transmitted to the backup/recovery control circuit 152 as needed.

The backup/recovery control circuit 152 generates a backup/recovery control signal for controlling data backup and recovery between the volatile register 162 and the nonvolatile register 163 included in the register 161 of the logic circuit 160 in accordance with a backup-free address transmitted from the backup-free address register 151, a power-off signal transmitted from the power-off request circuit 143, and a power-on request signal transmitted from the outside of the semiconductor device 100.

Note that the power-on request signal is, for example, a signal input from the outside of the semiconductor device 100 in the case where supply of power to the semiconductor device 100 is restarted after the supply of power to the semiconductor device 100 is stopped. Note that the supply of power to the semiconductor device 100 may be restarted in accordance with detection of transmission and reception of data to and from the semiconductor device.

Note that the backup/recovery control signal is, for example, a signal for controlling data backup from the volatile register 162 to the nonvolatile register 163 in a register that needs data backup or data recovery from the nonvolatile register 163 to the volatile register 162 in a register that needs data recovery in accordance with the backup-free address, the power-off signal, and the power-on request signal.

The power supply control circuit 153 generates a power supply control signal for controlling supply of power to the register 161 in accordance with the power-off signal and the power-on request signal when supply of power to the logic circuit 160 is stopped or restarted.

Note that the power supply control signal is, for example, a signal for separately controlling stop or restart of supply of power to the plurality of registers 161 included in the logic circuit 160.

The power gating control circuit 150 can generate a backup/recovery control signal for controlling data backup and recovery between the volatile register 162 and the nonvolatile register 163 included in the register 161 of the logic circuit 160 in accordance with the backup-free address, the power-off signal, and the power-on request signal. In addition, the power gating control circuit 150 can generate a power supply control signal for separately controlling stop or restart of supply of power to the plurality of registers 161 in accordance with the power-off signal and the power-on request signal when supply of power to the logic circuit 160 is stopped or restarted.

Figure 3:
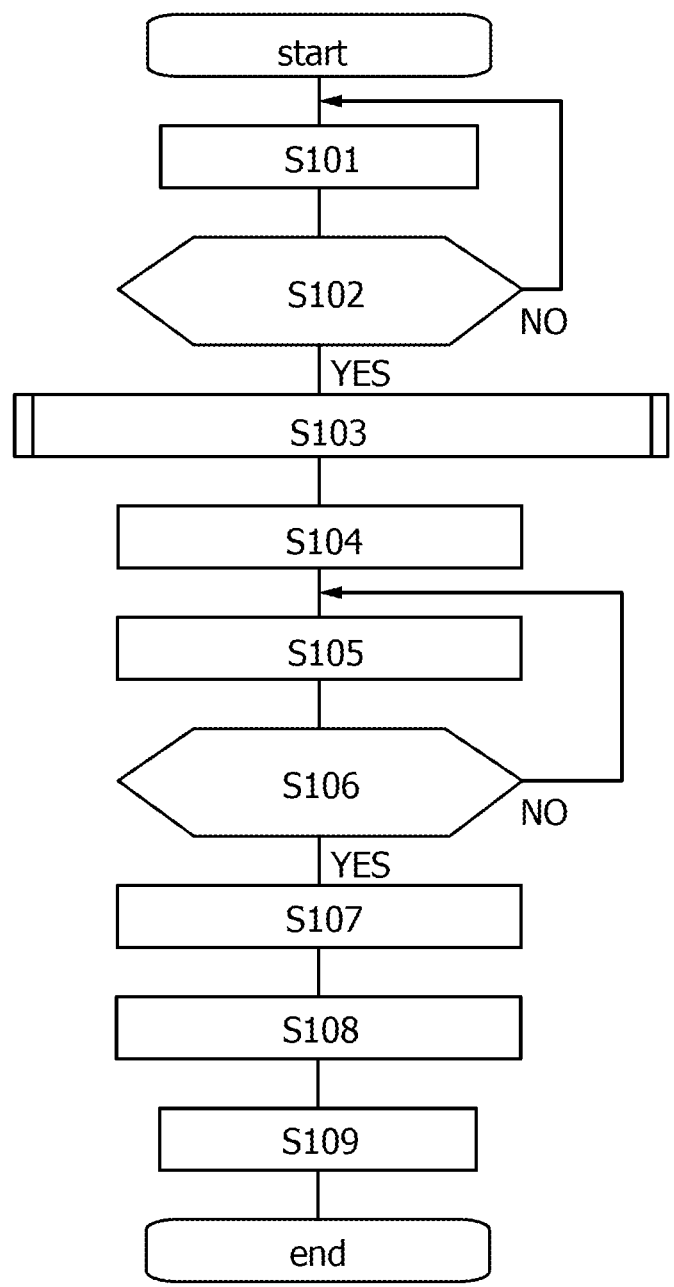
FIG. 3 is a flow chart illustrating semiconductor device operation.

FIG. 3 is a flow chart showing data backup operation and data recovery operation performed when supply of power to the semiconductor device 100 in FIG. 2 is stopped and restarted.

First, in Step S101, the semiconductor device 100 operates normally. A state in which the semiconductor device 100 operates normally means a state in which arithmetic processing of data input to the logic circuit 160 is performed by executing each instruction of the instruction group. In that case, power is supplied continuously and data obtained by arithmetic processing is stored in the volatile register 162 temporarily.

In Step S102, whether the semiconductor device 100 receives a power-off request signal is determined. In the case where the semiconductor device 100 receives a power-off request signal, the operation proceeds to Step S103. In the case where the semiconductor device 100 does not receive a power-off request signal, the operation returns to Step S101.

In Step S103, the register 161 that does not need data backup is determined. Operation of determining an address of a register whose data is backed up in Step S103 is described in detail with reference to FIG. 4, FIG. 5, FIG. 6, FIG. 7, FIGS. 8A and 8B, FIG. 9, and FIG. 10.

In Step S104, data is backed up from the volatile register 162 to the nonvolatile register 163 in the register 161 that needs data backup.

In Step S105, supply of power to the logic circuit 160 is stopped.

In Step S106, whether the semiconductor device 100 receives a power-on request signal is determined. In the case where the semiconductor device 100 receives a power-on request signal, the operation proceeds to Step S107. In the case where the semiconductor device 100 does not receive a power-on request signal, the operation returns to Step S105.

In Step S107, the power supply is restarted.

In Step S108, data is recovered from the nonvolatile register 163 to the volatile register 162 in the register 161 that needs data recovery.

As in Step S101, in Step S109, the semiconductor device 100 operates normally.

The flow chart in FIG. 3 shows that data loss before and after stop and restart of power supply can be prevented because data backup operation and data recovery operation can be performed when the supply of power to the semiconductor device 100 in FIG. 2 is stopped and restarted. In addition, the supply of power to the semiconductor device 100 can be stopped and restarted while the amount of data to be backed up and recovered can be reduced.

Next, FIG. 4, FIG. 5, FIG. 6, FIG. 7, FIGS. 8A and 8B, FIG. 9, and FIG. 10 specifically illustrate operation for reducing the amount of data to be backed up and recovered when the supply of power to the semiconductor device 100 is stopped and restarted. This operation corresponds to Step S103 in the flow chart in FIG. 3.

Figure 4:
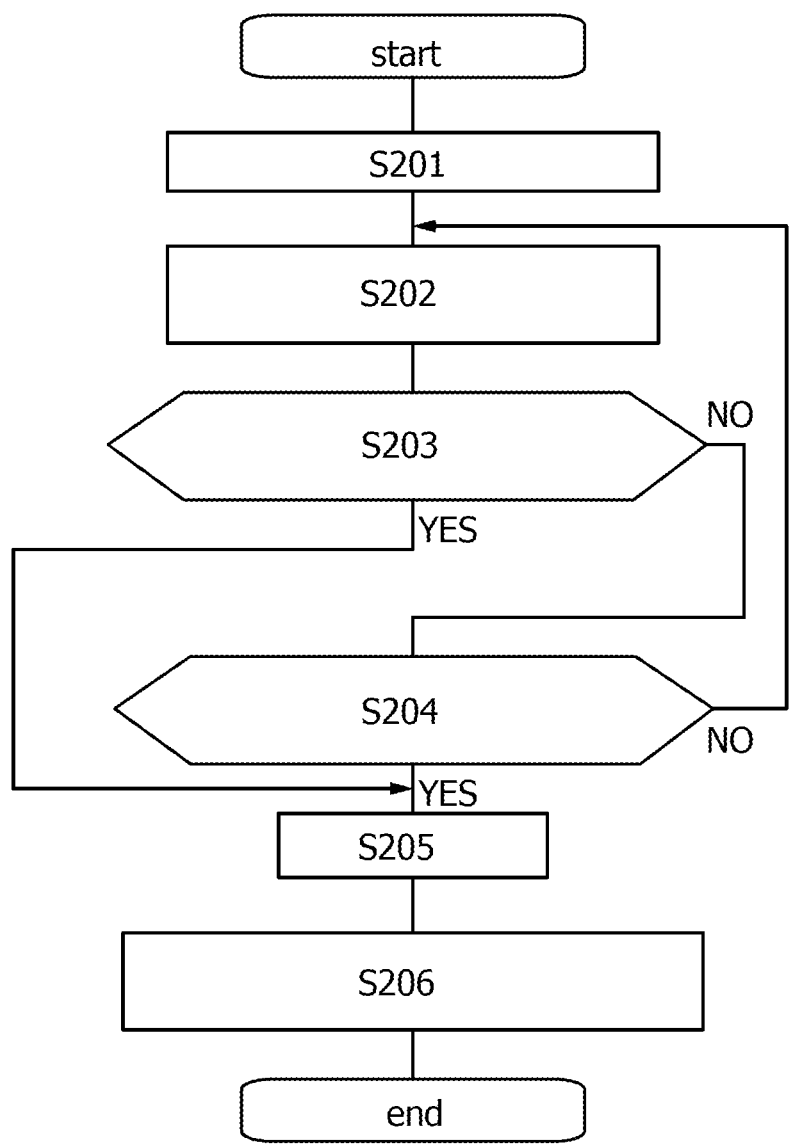
FIG. 4 is a flow chart illustrating semiconductor device operation.

First, a flow chart in FIG. 4 illustrates operation of the instruction decoder 130. Furthermore, FIG. 5 illustrates a visualized structure of an instruction group in the instruction decoder 130 in FIG. 2 to elaborate on the flow chart in FIG. 4.

First, in Step S201, the decoder 131 receives an instruction group stored in the instruction cache 110 through the instruction register 120.

Figure 5:
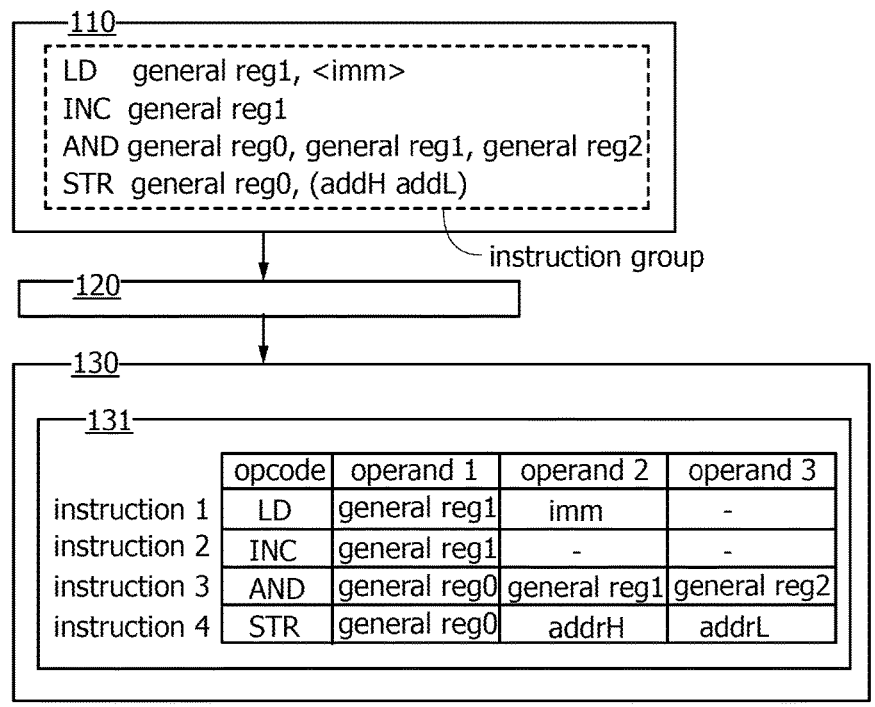
FIG. 5 illustrates a semiconductor device structure.

FIG. 5 illustrates a visualized example of an instruction group stored in the instruction cache 110. As the instruction group stored in the instruction cache 110, FIG. 5 illustrates an instruction 1) load instruction (LD), an instruction 2) increment instruction (INC), an instruction 3) AND instruction (AND), and an instruction 4) store instruction (STR). These instructions are written in high-level languages with a high abstraction level.

Note that the instruction 1) load instruction (LD) in FIG. 5 indicates that an immediate value (imm) is stored in a general register 1 (general reg 1).

The instruction 2) increment instruction (INC) in FIG. 5 indicates that the incremented value of the general reg 1 is stored in the general reg 1.

The instruction 3) AND instruction (AND) in FIG. 5 indicates that a calculated AND of the value of the general reg 1 and the value of a general register 2 (general reg 2) is stored in a general register 0 (general reg 0).

The instruction 4) store instruction (STR) in FIG. 5 indicates that the value of the general reg 0 is stored in an external memory having an upper address which corresponds to a value of a register addrH and a lower address which corresponds to a value of a register addrL.

Furthermore, FIG. 5 visually illustrates the instructions decoded by the decoder 131 in the instruction decoder 130.

Note that the instruction 1 in FIG. 5 is distinguished into an opcode "LD," an operand 1 "general reg 1," an operand 2 "immediate value (imm)," and an operand 3 "blank (−)" depending on decoding.

The instruction 2 in FIG. 5 is distinguished into an opcode "INC," the operand 1 "general reg 1," an operand 2 "blank (−)," and the operand 3 "blank (−)" depending on decoding.

The instruction 3 in FIG. 5 is distinguished into an opcode "AND," an operand 1 "general reg 0," an operand 2 "general reg 1," and an operand 3 "general reg 2" depending on decoding.

The instruction 4 in FIG. 5 is distinguished into an opcode "STR," the operand 1 "general reg 1," an operand 2 "addrH," and an operand 3 "addrL" depending on decoding.

In Step S202, a count value of the instruction counter 133 is incremented each time the instructions of the instruction group received in the decoder 131 are sequentially decoded and transmitted to the logic circuit 160.

The count value of the instruction counter 133 is incremented each time the decoder 131 in the instruction decoder 130 transmits the instruction to the logic circuit 160. The use of the count value can monitor the degree of progress of the instruction transmitted to the logic circuit 160.

In Step S203, whether the instruction register control circuit 132 receives a conditional branch signal from the logic circuit 160 is determined. In the case where the instruction register control circuit 132 receives a conditional branch signal from the logic circuit 160, the operation proceeds to Step S205. In the case where the instruction register control circuit 132 does not receive a conditional branch signal from the logic circuit 160, the operation proceeds to Step S204.

In Step S204, whether the decoder 131 decodes all the instructions of the instruction group and transmits the decoded instructions to the logic circuit 160 is determined. In the case where the decoder 131 decodes all the instructions of the instruction group and transmits the decoded instructions to the logic circuit 160, the operation proceeds to Step S205. In the case where the decoder 131 decodes all the instructions of the instruction group and transmits not all the decoded instructions to the logic circuit 160, the operation returns to Step S202.

In Step S205, the count value of the instruction counter 133 is reset. The count value is reset in Step S205 depending on whether the instruction register control circuit 132 receives a conditional branch signal or the decoder 131 decodes all the instructions of the instruction group and transmits the decoded instructions to the logic circuit 160.

In Step S206, the instruction register control circuit 132 transmits an instruction register control signal to the instruction register 120. The instruction register control signal is transmitted in Step S206 so that another instruction group is received by reception of a conditional branch signal or another instruction group is received by decoding all the instructions of the instruction group and transmitting the decoded instructions to the logic circuit 160.

The flow charts in FIG. 3 and FIG. 4 indicate that the instruction decoder 130 monitors the degree of progress of transmission of the instructions in the instruction group to the logic circuit in normal operation and determines a backup-free address of the register 161 included in the logic circuit 160 in accordance with the degree of progress when power supply is stopped.

Figure 6:
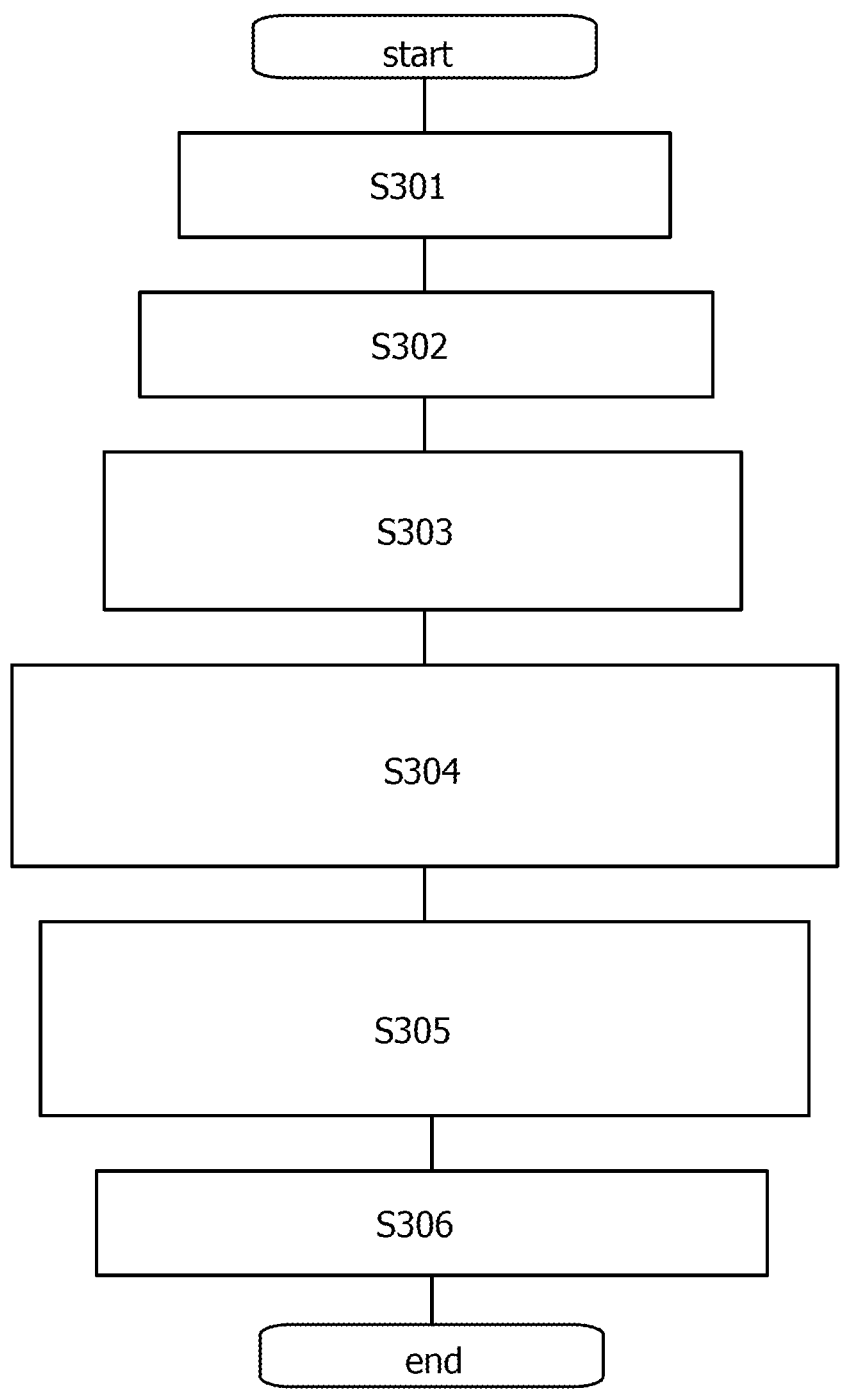
FIG. 6 is a flow chart illustrating semiconductor device operation.

Next, FIG. 6 is a flow chart for determining the address of the register 161 that does not need data backup when power supply is stopped, i.e., in Step S103 in the flow chart of FIG. 3. Furthermore, FIG. 7, FIGS. 8A and 8B, FIG. 9, and FIG. 10 visually illustrate opcodes, operands, and addresses of instructions in the instruction decoder 130, the backup need determination circuit 140, and the power gating control circuit 150 in FIG. 2 to elaborate on the flow chart in FIG. 6.

First, in Step S301, the instruction decoder 130 receives a power-off request signal.

In Step S302, the instruction counter 133 transmits a count value in the case of receiving a power-off request signal to the instruction readout circuit 134.

In Step S303, the instruction readout circuit 134 transmits operands and opcodes of instructions that are not transmitted to the logic circuit 160 in the instructions of the decoder 131 to the address determination circuit 141 in accordance with the count value in the case of receiving a power-off request signal.

Figure 7:
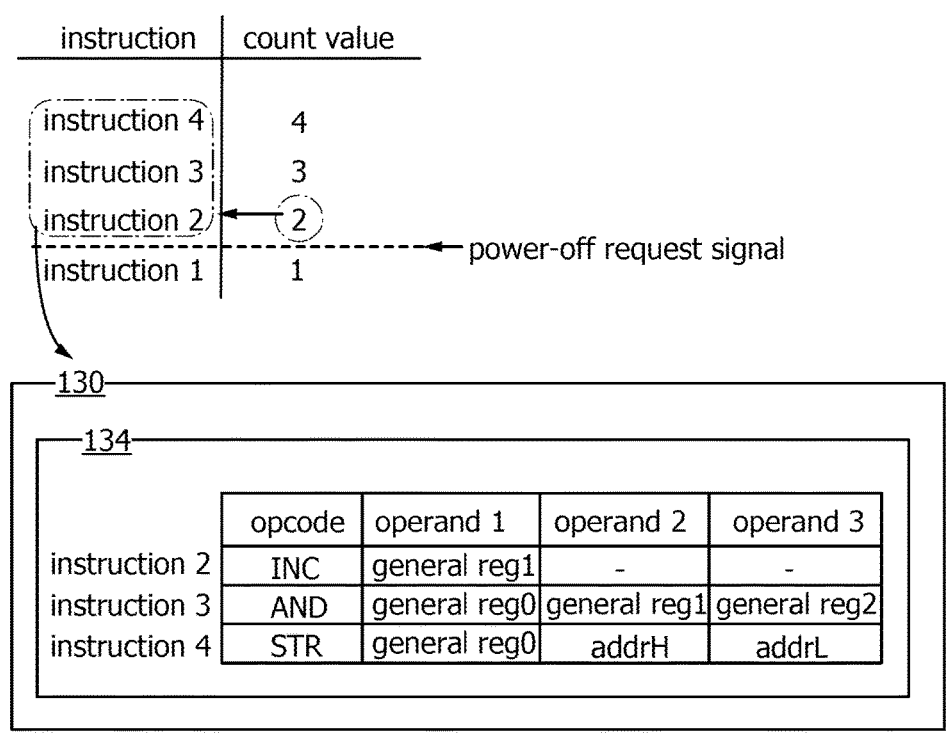
FIG. 7 illustrates a semiconductor device structure.

FIG. 7 illustrates visualized examples of operands and opcodes of instructions that are read from the decoder 131 to the instruction readout circuit 134 to be transmitted to the address determination circuit 141 in accordance with the count value in the case of receiving a power-off request signal described in Steps S301 to S303.

FIG. 7 illustrates an example in which the count value of the instruction counter 133 in the case of receiving a power-off request signal is "2." In that case, the instructions read by the instruction readout circuit 134 from the decoder 131 to be transmitted to the address determination circuit 141 are instructions from the instruction 2, i.e., instructions 2 to 4 in FIG. 7. Note that FIG. 7 illustrate the instructions 2 to 4 in FIG. 5 as the operands and opcodes of the instructions read by the instruction readout circuit 134 from the decoder 131.

In Step S304, the opcode of an instruction received by the address determination circuit 141 is determined, whether the address of the operand is a destination address or a source address is determined in accordance with the kind of the opcode, and the operand and the opcode are transmitted to the backup-free address determination circuit 142. The address determination circuit 141 preferably stores a reference table so that whether the address of each operand is a destination address or a source address can be determined in advance in accordance with the opcode of the instruction.

Figure 8A:
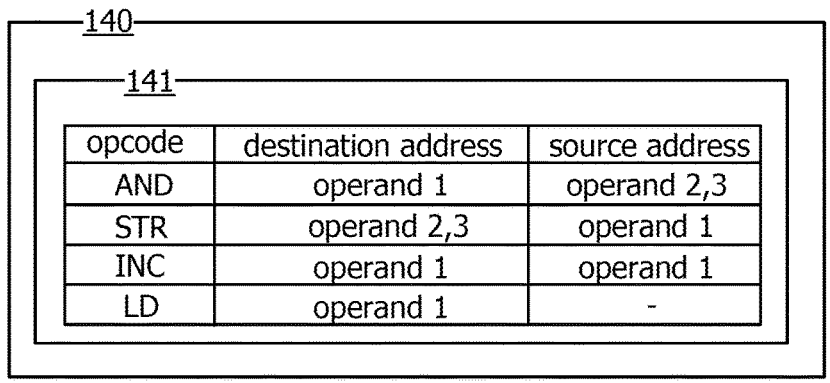
FIGS. 8A and 8B illustrate a semiconductor device structure.

FIG. 8A illustrates a visualized example of a table for determining whether the address of each operand is a destination address or a source address in accordance with the opcode of an instruction. Note that in FIG. 8A, as the table for determining whether the address of each operand is a destination address or a source address in accordance with the opcode of an instruction, "LD," "INC," "AND," and "STR" of the instructions 1 to 4 in FIG. 5 are illustrated.

Furthermore, FIG. 5 illustrates a visualized example in which "AND" of the instruction 3 in FIG. 8A is determined in accordance with the table in FIG. 8A. In the case of the opcode "AND," the destination address is "operand 1" and the source addresses are "operand 2" and "operand 3" with reference to the table in FIG. 8A. The "operand 1," "operand 2," and "operand 3" that are received by the address determination circuit 141 from the instruction readout circuit 134 are "general reg 0," "general reg 1," and "general reg 2." Accordingly, in the case of "AND" of the instruction 3, the destination address is "general reg 0" and the source addresses are "general reg 1" and "general reg 2."

Figure 8B:
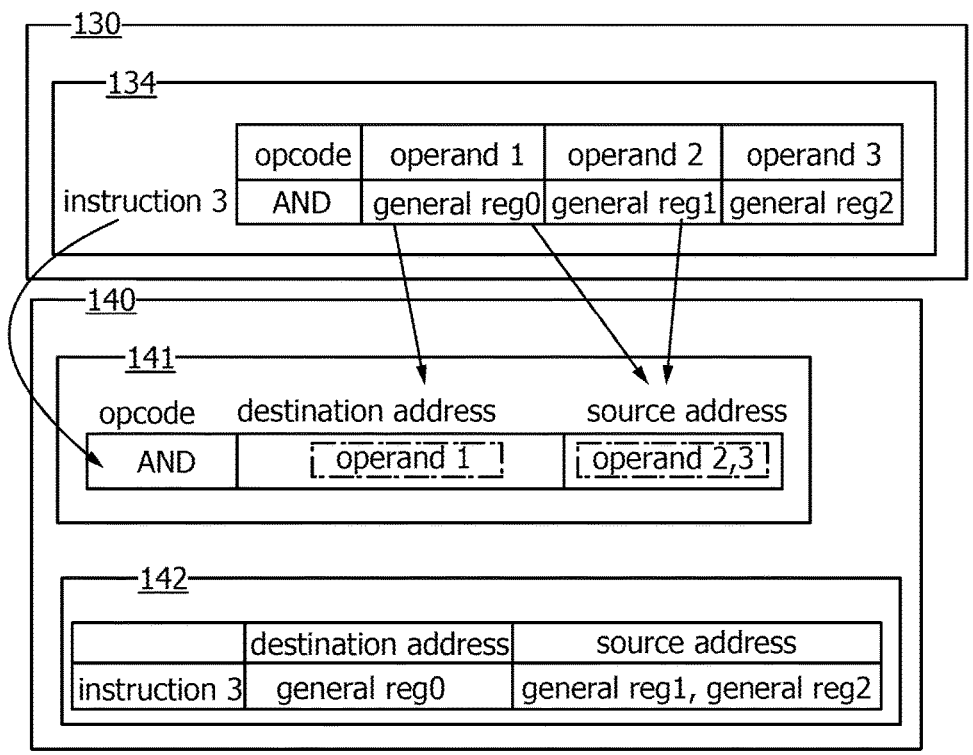
Figure 9:
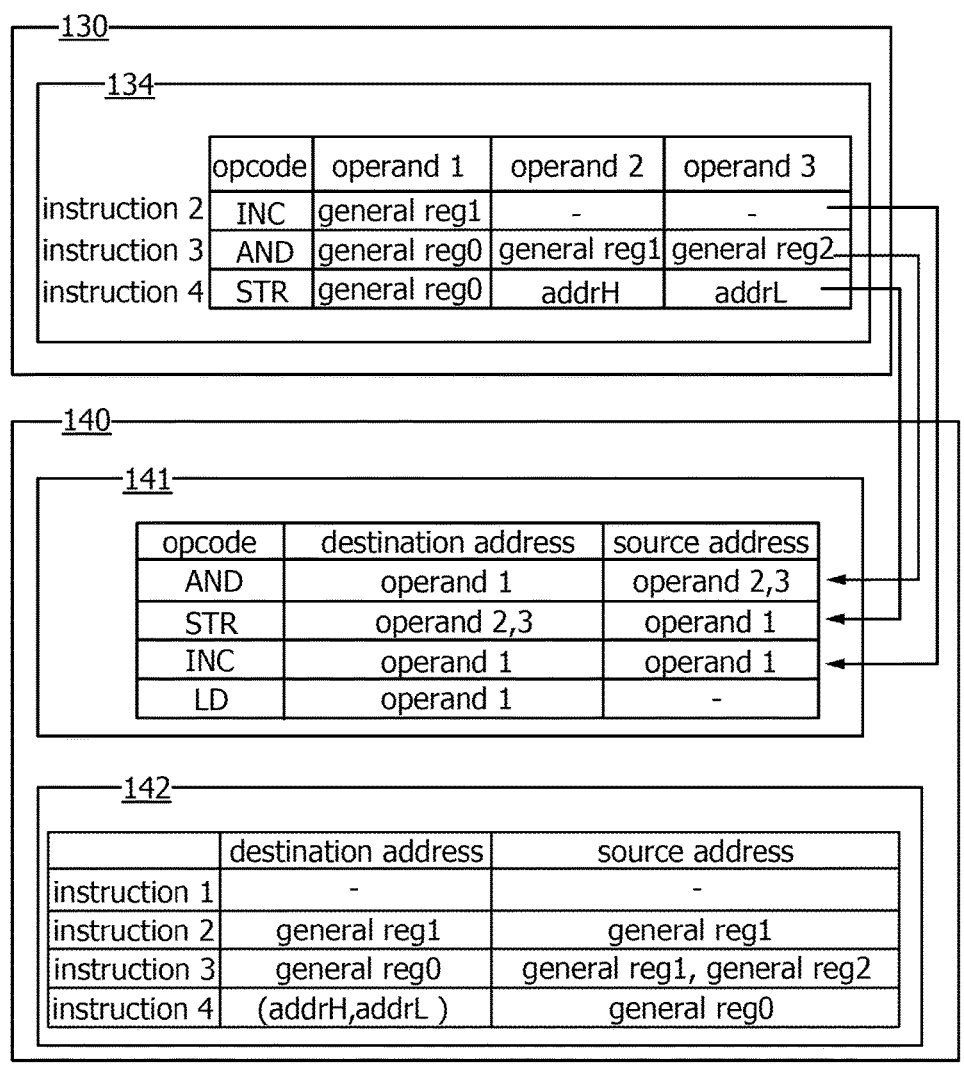
FIG. 9 illustrates a semiconductor device structure.

Furthermore, as in FIG. 8B, FIG. 9 illustrates a visualized example in which whether the address of each operand is a destination address or a source address is determined in accordance with the opcodes "INC" of the instruction 2 and "STR" of the instruction 4.

In the case of the opcode "INC," the destination address is "operand 1" and the source address is "operand 1" with reference to the table in FIG. 8A. In the case of the opcode "STR," the destination addresses are "operand 2" and "operand 3" and the source address is "operand 1" with reference to the table in FIG. 8A.

Accordingly, as illustrated in FIG. 9, in the case of "INC" of the instruction 2, the destination address is "general reg 1" and the source address is "general reg 1." In addition, as illustrated in FIG. 9, in the case of "STR" of the instruction 4, the destination addresses are "addrH" and "addrL" and the source address is "general reg 0." Note that here, the instruction 1 is blank (–) because it is not received from the instruction readout circuit 134.

In Step S305, the destination address and the source address of each instruction categorized by the backup-free address determination circuit 142 are compared by the comparison circuit 144, and the address of the register 161 that does not need data backup is transmitted to the backup-free address register 151 of the power gating control circuit 150 as a backup-free address.

Figure 10:
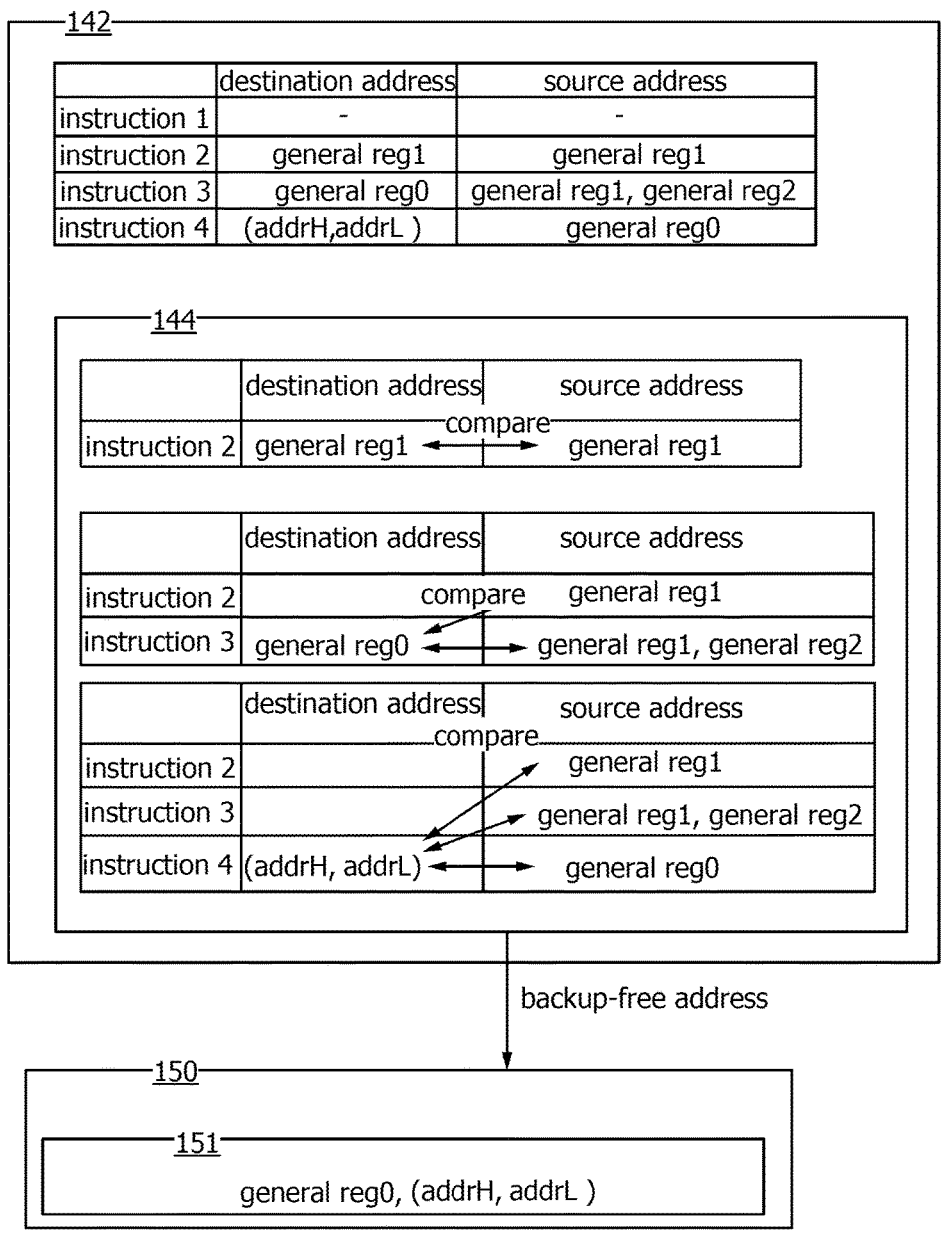
FIG. 10 illustrates a semiconductor device structure.

As in FIG. 9, FIG. 10 visually illustrates the destination address and the source address of each instruction categorized by the backup-free address determination circuit 142. Furthermore, FIG. 10 illustrates a visualized example in which the destination address and the source address of each instruction are compared by the comparison circuit 144 and the address of the register 161 that does not need data backup is transmitted to the backup-free address register 151 of the power gating control circuit 150 as a backup-free address.

The comparison circuit 144 in FIG. 10 compares the destination address of the instruction 2 with the source address of the instruction 2. In addition, the comparison circuit 144 compares the destination address of the instruction 3 with the source addresses of the instructions 2 and 3. Furthermore, the comparison circuit 144 compares the destination address of the instruction 4 with the source addresses of the instructions 2 to 4.

In the case of the comparison circuit 144 in FIG. 10, the destination address of the instruction 2 is "general reg 1" and the source address of the instruction 2 is "general reg 1"; thus, these addresses agree with each other. The destination address of the instruction 3 is "general reg 0," and the source address of the instruction 2 is "general reg 1" or the source addresses of the instruction 3 are "general reg 1" and "general reg 2"; thus, these addresses do not agree with each other. The destination addresses of the instruction 4 are "addrH" and "addrL," and the source address of the instruction 2 is "general reg 1," the source addresses of the instruction 3 are "general reg 1" and "general reg 2," or the source address of the instruction 4 is "general reg 0"; thus, these addresses do not agree with each other.

In the operation of the comparison circuit 144, the destination address that does not agree with the source address corresponds to the address of the register 161 that does not need data backup and a backup-free address transmitted to the backup-free address register 151. In the case of the comparison circuit 144 in FIG. 10, the backup-free addresses are "general reg 0," "addrH," and "addrL."

On the other hand, in the operation of the comparison circuit 144, the destination address that agrees with the source address corresponds to the address of the register 161 that needs data backup. In the case of the comparison circuit 144 in FIG. 10, the address of the register 161 that needs data backup is "general reg 1."

In the operation of the comparison circuit 144, after the power supply is restarted, whether data of the destination address is data of a source address used for executing an instruction after the power supply is stopped is determined to determine whether data needs to be backed up. Thus, after the power supply is restarted, the address of data rewritten by executing the instruction can be discarded.

In Step S306, the backup/recovery control circuit 152 transmits a backup/recovery control signal to the register 161 in the logic circuit 160 in accordance with a backup-free address. By the backup/recovery control signal, in the selected register 161, data of the volatile register 162 is backed up to the nonvolatile register 163.

The flow chart in FIG. 6 indicates that in the backup need determination circuit 140, the addresses of unexecuted instructions can be categorized into a destination address and a source address, and whether data needs to be backed up immediately before the power supply is stopped can be determined.

With the structure described in this embodiment, it is possible to reduce the amount of data to be backed up and recovered when supply of power to a semiconductor device in which data is backed up and recovered between a volatile register and a nonvolatile register is stopped and restarted. Thus, power for data backup and data recovery and the time to back up and recover data can be reduced.

This embodiment can be combined with any of the other embodiments as appropriate.

Embodiment 2

In this embodiment, a backup need determination circuit with a structure different from that in the semiconductor device 100 described in Embodiment 1 is described in which the kind of instruction decoded by an instruction decoder can be read and whether data needs to be backed up from a volatile register to a nonvolatile register can be determined.

An example of a block diagram of a semiconductor device is described with reference to FIG. 11.

A semiconductor device 300 in FIG. 11 includes the instruction cache 110, the instruction register 120, an instruction decoder 330, a backup need determination circuit 340, the power gating control circuit 150, and the logic circuit 160. The logic circuit 160 includes the register 161 in which a nonvolatile register and a volatile register are combined. The register 161 includes the volatile register 162 and the nonvolatile register 163.

The structure for determining the address of a register that does not need data backup by the instruction decoder 330 and the backup need determination circuit 340 of the semiconductor device 300 in FIG. 11 differs from that of the semiconductor device 100 in FIG. 2 described in Embodiment 1. Accordingly, differences from FIG. 2 are specifically described in this embodiment, and the description in Embodiment 1 is referred to for repetitive description.

The instruction decoder 330 has a function of transmitting an instruction obtained by decoding a received instruction group to a logic circuit and has a function of transmitting an instruction address of an unexecuted instruction in the received instruction group to the backup need determination circuit 340. The instruction decoder 330 included in the semiconductor device 300 can transmit an instruction address for determining whether data needs to be backed up when power supply is stopped to the logic circuit 160.

In FIG. 11, a decoder 331, the instruction register control circuit 132, the instruction counter 133, and an instruction address readout circuit 334 are provided in the instruction decoder 330.

The backup need determination circuit 340 has a function of determining a backup-free address for determining whether data needs to be backed up when power supply is stopped in accordance with an instruction address transmitted from the instruction decoder 330. The backup need determination circuit 340 included in the semiconductor device 300 can transmit a backup-free address to the power gating control circuit 150.

In FIG. 11, a backup-free address determination circuit 341 and the power-off request circuit 143 are provided in the backup need determination circuit 340.

The decoder 331 sequentially decodes received instruction groups. Decoded instructions are transmitted to the logic circuit 160. Furthermore, the decoder 331 decodes an instruction that is not counted and transmits an instruction address to the instruction address readout circuit 334 in accordance with a count value of the instruction counter 133. Furthermore, the decoder 331 increments the count value of the instruction counter 133 each time the decoder 331 decodes the instruction of the instruction group and transmits the decoded instruction to the logic circuit 160.

In the case where a power-off request signal is input to the instruction decoder 330, the instruction address readout circuit 334 transmits an instruction address obtained by decoding an instruction corresponding to the count value of the instruction counter 133 with the decoder 331 to the backup-free address determination circuit 341 in accordance with the count value. Furthermore, the instruction address readout circuit 334 transmits an instruction readout completion signal to the power gating control circuit 150 after transmission of the instruction address to the backup-free address determination circuit 341 is completed.

The instruction decoder 330 can transmit an instruction obtained by decoding a received instruction group to the logic circuit. In addition, the instruction decoder 330 can transmit an instruction register control signal to the instruction register 120 in accordance with a conditional branch signal. Furthermore, the instruction decoder 330 can transmit an instruction address of an instruction that is not transmitted to the logic circuit 160 in the received instruction group to the backup need determination circuit 340 in accordance with a power-off request signal. Furthermore, the instruction decoder 330 can transmit an instruction readout completion signal for notifying the power gating control circuit 150 of completion of transmission of the instruction address of the instruction that is not transmitted to the logic circuit 160 to the backup need determination circuit 340.

The backup-free address determination circuit 341 specifically determines which address of a register does not need data backup in accordance with an instruction address transmitted from the instruction address readout circuit 334.

Specifically, an address of the register that does not need data backup is determined in accordance with the instruction address transmitted from the instruction address readout circuit 334. The address of the data backup-free register that is determined in accordance with the instruction address may be produced by an operating system or may be produced at the same time as production of an application program.

The backup need determination circuit 340 can determine a backup-free address for determining whether data needs to be backed up when power supply is stopped in accordance with an instruction address transmitted from the instruction address readout circuit 334. In addition, the backup need determination circuit 340 can generate a power-off signal for requesting the power gating control circuit 150 to stop power supply in accordance with an instruction readout completion signal transmitted from the instruction readout circuit 334.

Figures 12A, 12B:
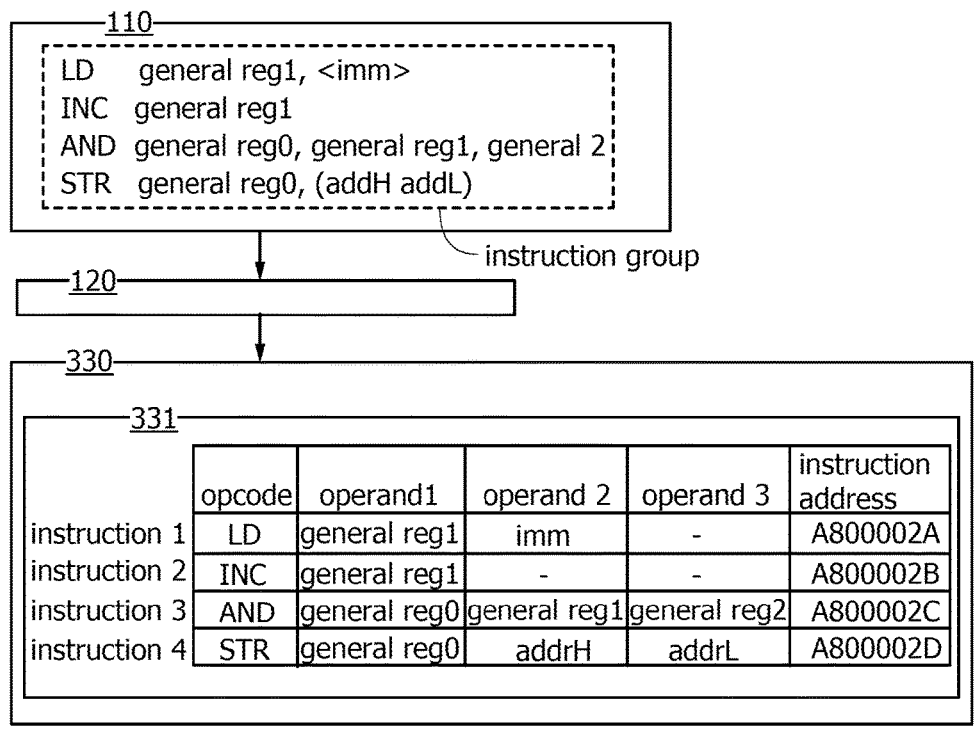
FIGS. 12A and 12B illustrate a semiconductor device structure.

In FIG. 12A, the instruction decoder 130 and the decoder 131 in FIG. 5 are replaced with the instruction decoder 330 and the decoder 331, and a visualized example of an instruction group stored in the decoder 331 is illustrated.

As illustrated in FIG. 12A, when the decoder 331 in this embodiment decodes the instruction group, the decoder 331 provides each instruction with an instruction address in addition to an opcode and an operand. Note that in FIG. 12A, the decoder 331 provides the instructions 1 to 4 with "A800002A" to "A800002D" as examples of the instruction address; however, the decoder 331 may provide the instructions 1 to 4 with given addresses as long as the instructions 1 to 4 can be distinguished from each other and the given addresses are produced by a rule similar to that of the instruction address in the table for determining the backup-free address.

Here, any one of "A800002A" to "A800002D" of the instructions 1 to 4 in FIG. 12A is transmitted to the backup-free address determination circuit 341 through the instruction address readout circuit 334.

FIG. 12B also illustrates a visualized example of the table for determining the backup-free address that corresponds to the instruction address. For example, in FIG. 12B, in the case where the count value of the instruction counter 133 at the time when a power-off request signal is received is "2" and the instruction address of the instruction 2 is transmitted from the instruction address readout circuit 334 to the backup-free address determination circuit 341, the backup-free addresses are "general reg 0," "addrH," and "addrL."

With the structure described in this embodiment, it is possible to reduce the amount of data to be backed up and recovered when supply of power to a semiconductor device in which data is backed up and recovered between a volatile register and a nonvolatile register is stopped and restarted. Thus, power for data backup and data recovery and the time to back up and recover data can be reduced.

This embodiment can be combined with any of the other embodiments as appropriate.

Embodiment 3

The register in which a nonvolatile register and a volatile register are combined in Embodiments 1 and 2 is described with reference to FIG. 13.

Figure 13:
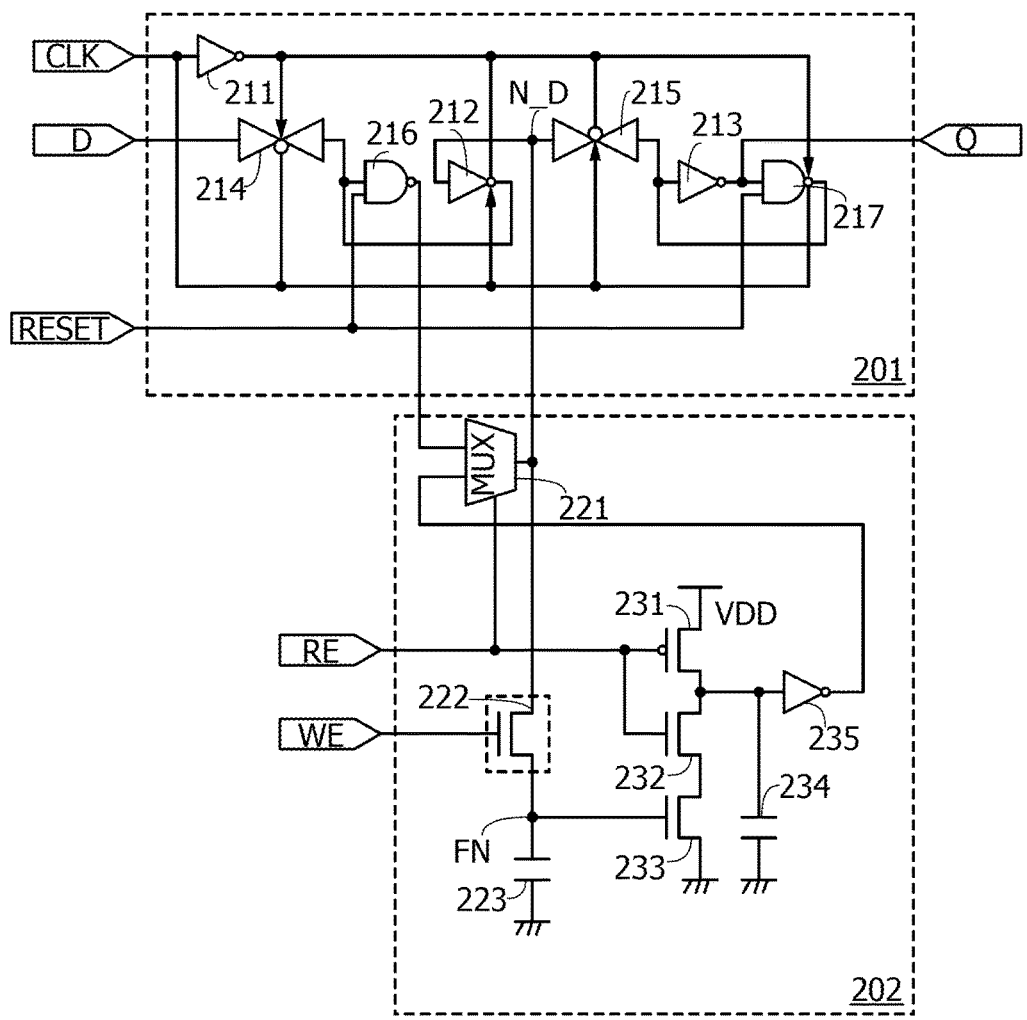
FIG. 13 is a circuit diagram illustrating a structure example of a register including a volatile register and a nonvolatile register.

FIG. 13 is a circuit diagram of a register in which a nonvolatile register and a volatile register each having a 1-bit storage capacity are combined. The register in FIG. 13 includes storage circuit 201 and a storage circuit 202. The storage circuit 201 is a 1-bit volatile register, and the storage circuit 202 is a 1-bit nonvolatile register. Note that each of the storage circuit 201 and the storage circuit 202 can include another element such as a diode, a resistor, or an inductor as needed.

The storage circuit 201 includes inverters 211 to 213, transmission gates 214 and 215, and NANDs 216 and 217. During a power supply period, the storage circuit 201 stores data. In addition, during a period immediately before the power supply is stopped, the storage circuit 201 writes the stored data to the storage circuit 202. Furthermore, during a period immediately after the power supply is restarted, the storage circuit 201 reads the data written to the storage circuit 202 and uses the data as data of the storage circuit 201.

The storage circuit 202 includes a selector 221, a transistor 222, a capacitor 223, transistors 231 to 233, a capacitor 234, and an inverter 235. During a power supply stop period, the storage circuit 202 can store data.

The inverter 211 has a function of generating a clock signal CLKb obtained by inverting the polarity of the potential of a clock signal CLK. The transmission gate 214, the transmission gate 215, the inverter 212, and the NAND 217 each determine output of a signal in response to the clock signal CLK and the clock signal CLKb.

The transmission gate 214 has a function of supplying a data signal D supplied to an input terminal of the transmission gate 214 to a first input terminal of the NAND 216 when the potential of the clock signal CLK is low and the potential of the clock signal CLKb is high. In addition, the transmission gate 214 has high impedance and has a function of stopping supply of the data signal D to the first input terminal of the NAND 216 when the potential of the clock signal CLK is high and the potential of the clock signal CLKb is low.

The NAND 216 has two inputs. The data signal D output from the transmission gate 214 or a signal output from the inverter 212 is supplied to the first input terminal of the NAND 216, and a control signal RESET is supplied to a second input terminal of the NAND 216. The NAND 216 has a function of outputting a signal to a first input terminal of the selector 221 in accordance with the signals input to the first input terminal and the second input terminal of the NAND 216.

The selector 221 is a multiplexer having two inputs. A signal output from the NAND 216 is supplied to a first input terminal of the selector 221, and a signal output from the inverter 235 is supplied to a second input terminal of the selector 221. The selector 221 has a function of outputting a signal input to the first input terminal of the selector 221 to an input terminal of the inverter 212, an input terminal of the transmission gate 215, and a first terminal of the transistor 222 when the potential of a control signal RE is low. Furthermore, the selector 221 has a function of outputting a signal input to the second input terminal of the selector 221 to the input terminal of the inverter 212, the input terminal of the transmission gate 215, and the first terminal of the transistor 222 when the potential of the control signal RE is high.

The inverter 212 has functions of inverting the polarity of the potential of a signal supplied to the input terminal of the inverter 212 and outputting the inverted signal when the potential of the clock signal CLK is high and the potential of the clock signal CLKb is low. The output signal is supplied to the second input terminal of the NAND 216. In addition, the inverter 212 has high impedance and has a function of stopping supply of the signal to the second input terminal of the NAND 216 when the potential of the clock signal CLK is low and the potential of the clock signal CLKb is high.

The inverter 213 has functions of inverting the polarities of the potentials of signals supplied from an output terminal of the transmission gate 215 and an output terminal of the NAND 217 and outputting the inverted signals as signals Q. The signal Q output from the inverter 213 is supplied to a first input terminal of the NAND 217.

The NAND 217 has two inputs. A signal output from the inverter 213 is supplied to the first input terminal of the NAND 217, and the control signal RESET is supplied to a second input terminal of the NAND 217. The NAND 217 has a function of outputting a signal to an input terminal of the inverter 213 in accordance with the signals input to the first input terminal and the second input terminal of the NAND 217.

The on/off state of the transistor 222 is controlled in accordance with the potential of a control signal WE. The transistor 222 has a function of controlling supply of the potential of a node N_D of the storage circuit 201 to a floating node FN. The potential of the node N_D corresponds to data 1 or 0 of the storage circuit 201.

The floating node FN of the storage circuit 202 is a data storage portion. The potential of the floating node FN is held by the transistor 222 and the capacitor 223. The on/off state of the transistor 233 is controlled in accordance with the potential of the floating node FN.

To improve the charge retention characteristics of the storage circuit 202, the off-state current of the transistor 222 is preferably extremely low because the amount of electric charge leaking from the floating node FN can be reduced. As a transistor having lower leakage current than a transistor formed using single crystal silicon, a transistor formed using a thin film of an oxide semiconductor can be used.

An oxide semiconductor, especially a highly purified oxide semiconductor (purified OS) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly purified oxide semiconductor layer has extremely low off-state current and high reliability; thus, the transistor is suitable for the transistor 222.

The on/off state of each of the transistor 231 and the transistor 232 is controlled by the control signal RE. Each of the transistor 231 and the transistor 232 has a function of controlling charging and discharging of electric charge in the capacitor 234 by a potential VDD. When the control signal RE is low, the transistor 231 is turned on and the transistor 232 is turned off, so that the capacitor 234 is charged by the potential VDD.

When the control signal RE is high, the transistor 231 is turned off and the transistor 232 is turned on. In that case, when the transistor 233 is on, electric charge stored in the capacitor 234 is discharged. In addition, when the transistor 233 is off, the electric charge stored in the capacitor 234 is not discharged. Depending on whether the electric charge is discharged, data stored in the floating node FN of the storage circuit 202 can be converted into the potential of the capacitor 234 so as to be used as the data 1 or 0. The potential of the capacitor 234 is output to the second input terminal of the selector 221 through the inverter 235.

In the semiconductor device including the register in FIG. 13, a circuit can include the oxide semiconductor transistor 222 and other silicon transistors. The oxide semiconductor transistor 222 and the other silicon transistors can be stacked. Consequently, in the semiconductor device including the register in FIG. 13, the transistors can be formed over one chip through consecutive steps.

Compared with a semiconductor device that includes a nonvolatile register formed using a magnetoresistive random access memory (MRAM), a semiconductor device that includes a nonvolatile register formed using the oxide semiconductor transistor 222 with extremely low off-state current can reduce power consumption (overhead) caused by data backup operation and data recovery operation. Current for writing data to the MRAM is 50 to 500 μA, whereas current for writing data to the nonvolatile register in FIG. 13 that is formed using the oxide semiconductor transistor can be approximately $\frac{1}{100}$ of that of the MRAM because data is written by supply of electric charge to the capacitor. Accordingly, in the semiconductor device including the register in FIG. 13, a power-off time during which overhead and power reduced by stopping power supply are equal, i.e., a break-even time (BET) can be shorter than that of a register formed using an MRAM.

Figure 14:
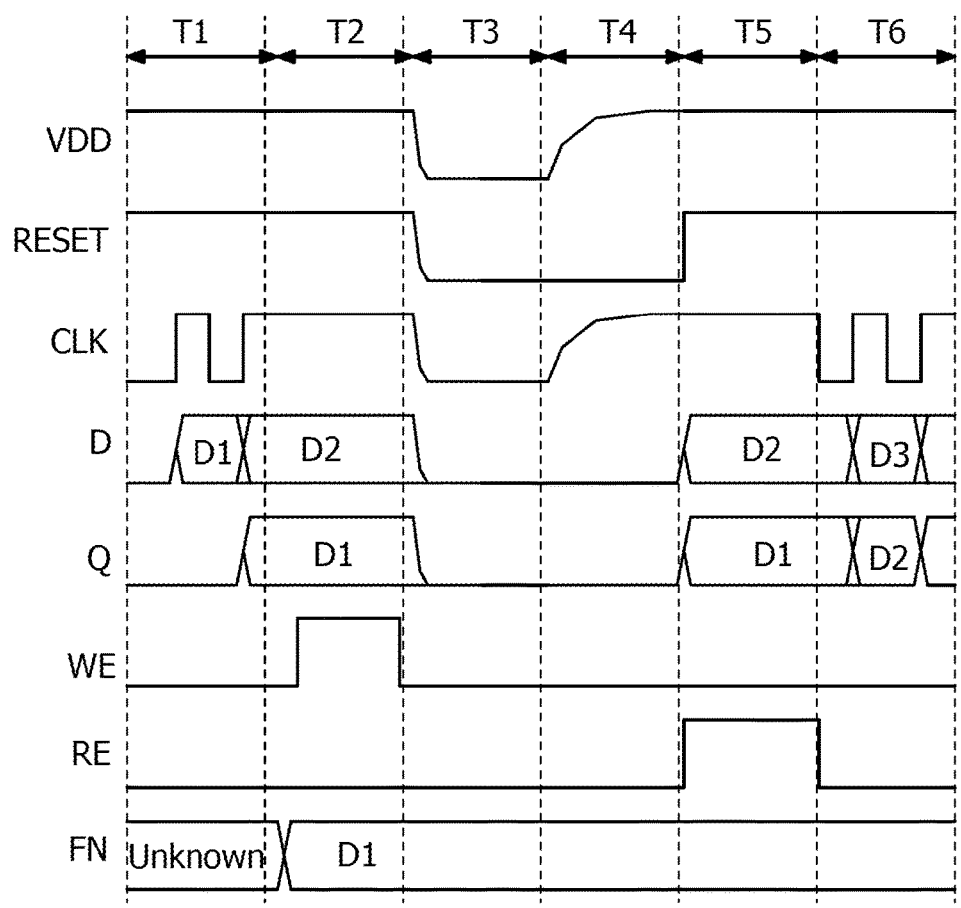
FIG. 14 is a timing chart of a register including a volatile register and a nonvolatile register.

Next, FIG. 14 shows a timing chart of the register in FIG. 13.

In normal operation (T1), an output signal of the NAND 216 is selected as an output signal of the selector 221 by the control signal RE having a low-level potential. In that case, the storage circuit 201 can operate as a normal D flip-flop.

In a period (T2) during which data is written to the storage circuit 202, the potential of the clock signal CLK is fixed at a high level to determine data (D2) of the storage circuit 201, and the potential of the control signal WE is set high. In that case, the floating node FN of the storage circuit 202 has a potential that reflects the data of the storage circuit 201, and data stored in the storage circuit 201 is stored in the storage circuit 202.

In a power-off period (T3), the potential (data) of the floating node FN is held by the control signal WE having a low-level potential. At this time, supply of power supply voltage to the storage circuit 202 is stopped and each control signal has a low-level potential.

In a power-on period (T4), the supply of power supply voltage is restarted and the capacitor 234 is charged by setting the potential of the control signal RE low. Note that the potential of the clock signal CLK at this time is fixed at a high level.

In a period (T5) during which data is read from the storage circuit 202, the potential of the control signal RE is set high, and whether electric charge is discharged from the capacitor 234 in accordance with the potential of the floating node FN is selected. At this time, by setting the potential of the control signal RE high, an output signal of the inverter 235 is selected as the output signal of the selector 221 and data stored in the storage circuit 202 is read to the storage circuit 201. In addition, at this time, the storage circuit 201 fixes the potential of the clock signal CLK at a high level so that the data read from the storage circuit 202 is fixed.

Then, in normal operation (T6), input of the clock signal CLK and data (D3) is restarted.

As described above, in the semiconductor device including the registers in FIG. 13 and FIG. 14, the storage circuit 201 functioning as a volatile register can operate as a D flip-flop in the normal operation. Thus, even when the storage circuit 202 functioning as a nonvolatile register is added, the storage circuit 202 can operate at high speed in the normal operation without being influenced by the oxide semiconductor transistor that limits the operation.

Furthermore, in the semiconductor device including the registers in FIG. 13 and FIG. 14, the operating state (on or off state) of the transistor 233 is selected in accordance with the potential held in the floating node FN in the storage circuit 202, so that data 0 or 1 is read depending on the operating state. Thus, the original data can be read accurately even when the amount of electric charge held in the floating node FN fluctuates to some degree during the power-off period (T3).

This embodiment can be combined with any of the other embodiments as appropriate.

Embodiment 4

In this embodiment, an oxide semiconductor layer that can be used as the semiconductor layer of the transistor with low off-state current described in the above embodiment is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide whose composition is in the neighborhood of the above composition is preferably used.

When an oxide semiconductor film included in the semiconductor layer contains a large amount of hydrogen, hydrogen and the oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) or substantially intrinsic oxide semiconductor film. Note that the substantially intrinsic oxide semiconductor film means an oxide semiconductor film that contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an intrinsic (i-type) or substantially intrinsic i-type oxide semiconductor film can have extremely favorable off-state current characteristics. For example, the drain current at the time when the transistor including an oxide semiconductor film is off can be less than or equal to $1\times10^{-18}$ A, preferably less than or equal to $1\times10^{-21}$ A, and more preferably $1\times10^{-24}$ A at room temperature (approximately 25° C.); or less than or equal to $1\times10^{-15}$ A, preferably $1\times10^{-18}$ A, more preferably less than or equal to $1\times10^{-21}$ A at 85° C. The off state of a transistor refers to a state where gate voltage is much lower than the threshold voltage in an n-channel transistor. Specifically, when the gate voltage is lower than the threshold voltage by 1 V or more, 2 V or more, or 3 V or more, the transistor is off.

Next, the structure of the oxide semiconductor film is described.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

This embodiment can be combined with any of the other embodiments as appropriate.

Embodiment 5

In this embodiment, cross-sectional structures of transistors included in a register of a semiconductor device according to one embodiment of the disclosed invention are described with reference to drawings.

FIG. 15 illustrates an example of part of a cross-sectional structure of a semiconductor device according to one embodiment of the disclosed invention. Note that FIG. 15 illustrates the transistor 222, the transistor 232, and the capacitor 223 described in Embodiment 3.

In this embodiment, the transistor 232 is formed in a single crystal silicon substrate, and the transistor 222 including a semiconductor layer containing an oxide semiconductor is formed above the transistor 232. The transistor 232 may include a semiconductor thin film of silicon, germanium, or the like in an amorphous, microcrystalline, polycrystalline, or single crystal state as a semiconductor layer.

In the case where the transistor 232 is formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Note that in the case where, among transistors included in the register of the semiconductor device described in Embodiment 3, the transistor 222 contains an oxide semiconductor and the other transistors including the transistor 232 contain silicon, the number of oxide semiconductor transistors is smaller than that of silicon transistors. As a result, the design rule of the transistor 222 can be relaxed by stacking the transistor 222 over a silicon transistor.

The chip area of the semiconductor device can be reduced with the use of such a register in which a silicon transistor and an oxide semiconductor transistor are stacked. Since the number of silicon transistors is larger than that of oxide semiconductor transistors in one circuit block, the actual chip area of the semiconductor device depends on the number of silicon transistors. In addition, a volatile register formed using a silicon transistor and a nonvolatile register formed using a silicon transistor and an oxide semiconductor transistor can be formed over one chip in consecutive steps.

In FIG. 15, the n-channel transistor 232 is formed in a semiconductor substrate 800.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor 232 is electrically isolated from another transistor by an element isolation insulating film 801. The element isolation insulating film 801 can be formed by a local oxidation of silicon (LOCOS) method, a trench isolation method, or the like.

Specifically, the transistor 232 includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor 232. Openings are formed in the insulating film 809. Wirings 810 and 811 that are in contact with the impurity regions 802 and 803, respectively, and a wiring 812 that is in contact with the gate electrode 804 is formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

In FIG. 15, the transistor 222 and the capacitor 223 are formed over the insulating film 820.

The transistor 222 includes, over the insulating film 820, a semiconductor film 830 containing an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the gate insulating film 831 to overlap with the conductive film 833. A portion where the conductive films 833 and 835 overlap with each other with the gate insulating film 831 positioned therebetween functions as the capacitor 223.

Note that in FIG. 15, the capacitor 223 is provided over the insulating film 820 together with the transistor 222. However, the capacitor 223 may be provided below the insulating film 820 together with the transistor 232.

An insulating film 841 is provided over the transistor 222 and the capacitor 223. An opening is provided in the insulating film 841. Over the insulating film 841, a conductive film 843 that is in contact with the gate electrode 834 through the opening is provided.

Note that in FIG. 15, the transistor 222 includes the gate electrode 834 on at least one side of the semiconductor film 830. Alternatively, the transistor 222 may include a pair of gate electrodes with the semiconductor film 830 positioned therebetween.

When the transistor 222 includes a pair of gate electrodes with the semiconductor film 830 positioned therebetween, a signal for controlling an on state or an off state may be supplied to one of the gate electrodes, and the other of the gate electrodes may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor 222 can be controlled.

The semiconductor film 830 is not necessarily formed using a single oxide semiconductor film, and may be formed using a stack of a plurality of oxide semiconductor layers. For example, FIGS. 16A and 16B each illustrate a structure example of the transistor 222 in which the semiconductor film 830 has a three-layer structure.

Figure 16A:
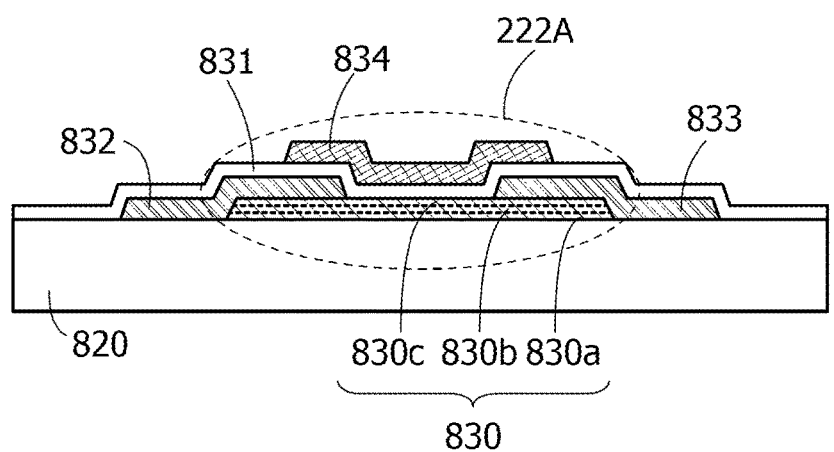
FIGS. 16A and 16B are cross-sectional views of transistors.

A transistor 222A in FIG. 16A includes a semiconductor film 830 provided over an insulating film 820 and the like, conductive films 832 and 833 electrically connected to the semiconductor film 830, a gate insulating film 831, and a gate electrode 834 that is provided over the gate insulating film 831 to overlap with the semiconductor film 830.

In the transistor 222A, oxide semiconductor layers 830$a$ to 830$c$ are stacked sequentially from the insulating film 820 side as the semiconductor film 830.

Each of the oxide semiconductor layers 830$a$ and 830$c$ is an oxide layer that contains at least one of metal elements contained in the oxide semiconductor layer 830$b$ and in which energy at the bottom of the conduction band is closer to the vacuum level than that in the oxide semiconductor layer 830$b$ by higher than or equal to 0.05 eV, 0.07 eV, 0.1 eV, or 0.15 eV and lower than or equal to 2 eV, 1 eV, 0.5 eV, or 0.4 eV. The oxide semiconductor layer 830$b$ preferably contains at least indium because carrier mobility is increased.

Figure 16B:
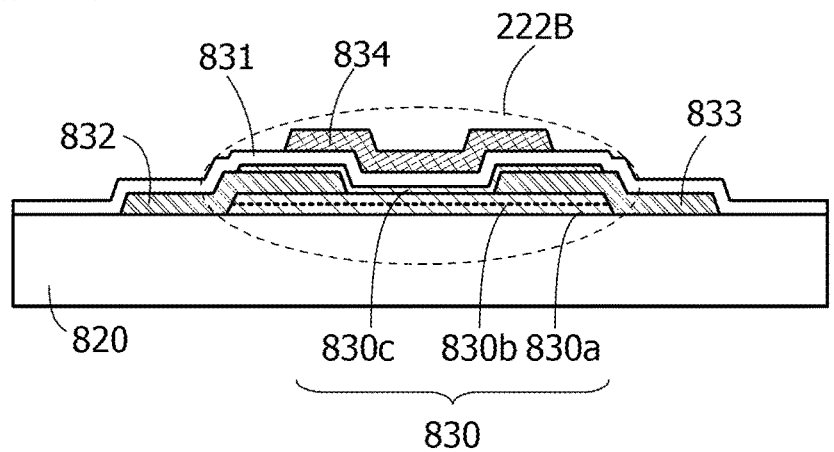

Note that like a transistor 222B in FIG. 16B, the oxide semiconductor layer 830$c$ may be provided over the conductive films 832 and 833 to overlap with the gate insulating film 831.

This embodiment can be combined with any of the other embodiments as appropriate.

Embodiment 6

In this embodiment, examples in which the semiconductor device described in the above embodiment is used in an electronic component and examples in which the semiconductor device described in the above embodiment is used in an electronic device including the electronic component are described with reference to FIGS. 17A and 17B and FIGS. 18A to 18E.

Figure 17A:
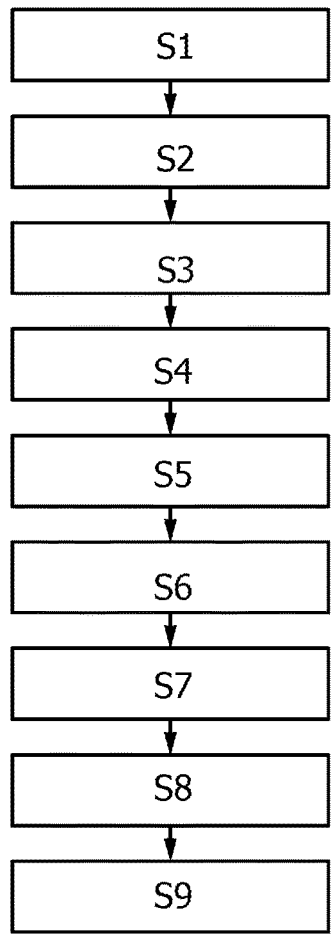
FIG. 17A is a flow chart illustrating steps of manufacturing a semiconductor device.

FIG. 17A illustrates an example in which the semiconductor device described in the above embodiment is used in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor as illustrated in FIG. 15 in Embodiment 5 can be completed after an assembly process (post-process) by using a plurality of components that can be detached and attached from and to a printed wiring board in combination.

The post-process can be finished through each step in FIG. 17A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, bonding between the chip and the lead frame may be conducted by mounting the chip on an interposer.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that a mounted circuit portion or wire can be protected against mechanical external force. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Then, printing (marking) is performed on a surface of the package (Step S7). Through the final inspection process (Step S8), the electronic component is completed (Step S9).

The above electronic component can include the semiconductor device described in the above embodiment. Thus, it is possible to obtain an electronic component including a semiconductor device with which data processing speed is increased and data confidentiality is improved. Since the electronic component includes a semiconductor device with which data processing speed at the time of stopping and restarting power supply is increased and data confidentiality is improved, the electronic component consumes less power and has improved convenience.

Figure 17B:
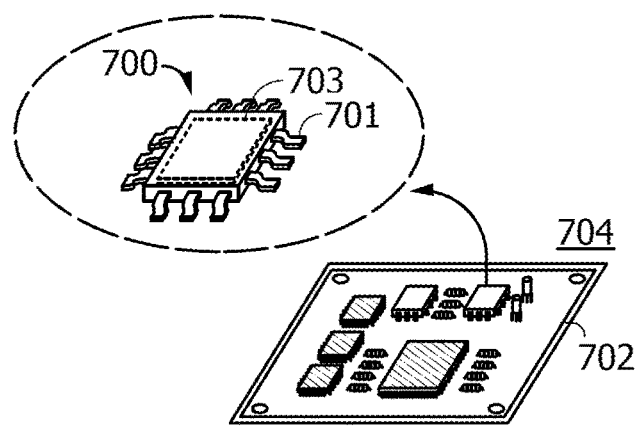
FIG. 17B is a schematic perspective view of a completed electronic component.

FIG. 17B is a schematic perspective view of the completed electronic component. FIG. 17B illustrates a schematic perspective view of a quad flat package (QFP) as an example of the electronic component. A lead 701 and a semiconductor device 703 of an electronic component 700 are illustrated in FIG. 17B. The electronic component 700 in FIG. 17B is mounted on a printed wiring board 702, for example. When the plurality of electronic components 700 are used in combination and electrically connected to each other over the printed wiring board 702, a board on which the electronic components are mounted (a mounted board 704) is completed. The completed mounted board 704 is provided in an electronic device or the like.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 18A:
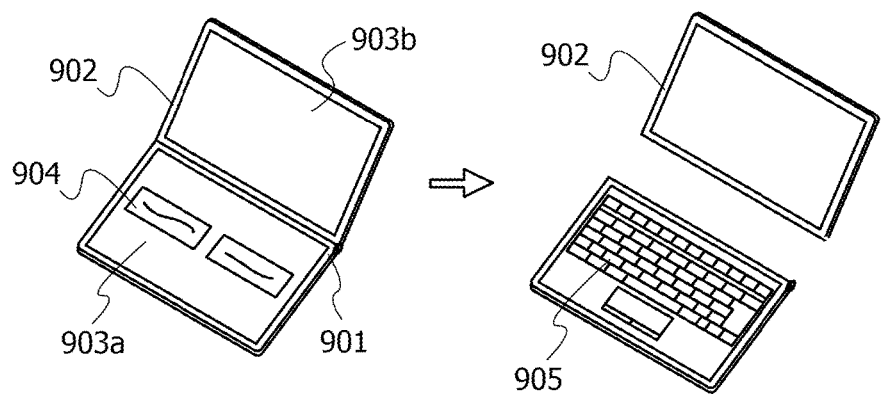
FIGS. 18A to 18E each illustrate an electronic device including a semiconductor device.

FIG. 18A illustrates a portable information terminal, which includes a housing 901, a housing 902, a first display portion 903a, a second display portion 903b, and the like. A board on which an electronic component including the semiconductor device described in the above embodiment is provided is mounted on at least one of the housings 901 and 902. Thus, a portable information terminal that consumes less power and has improved convenience is obtained.

Note that the first display portion 903a is a touch panel, and for example, as illustrated in the left of FIG. 18A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 18A. With the keyboard 905, letters can be input quickly by keyboard input as in the case of using a conventional information terminal, for example.

Furthermore, one of the first display portion 903a and the second display portion 903b can be detached from the portable information terminal as illustrated in the right in FIG. 18A. The first display portion 903a can also function as a touch panel for a reduction in weight to carry around to be operated by one hand while the other hand supports the housing 902, which is convenient.

The portable information terminal in FIG. 18A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 18A may transmit and receive data wirelessly. Through wireless communication, desired book data or the like can be purchased and downloaded from an electronic book server.

Furthermore, the housing 902 in FIG. 18A may have an antenna, a microphone function, or a wireless communication function to be used as a cellular phone.

Figure 18B:
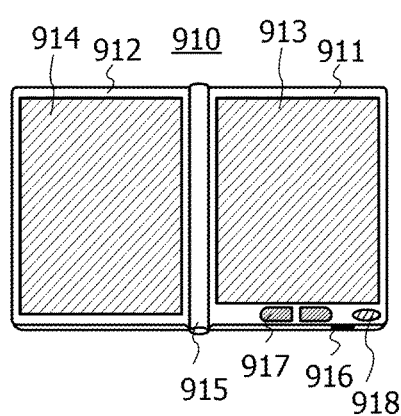

FIG. 18B illustrates an e-book reader 910 including electronic paper. The e-book reader 910 includes two housings 911 and 912. The housing 911 and the housing 912 include a display portion 913 and a display portion 914, respectively. The housings 911 and 912 are connected to each other by a hinge 915, so that the e-book reader 910 can be opened and closed using the hinge 915 as an axis. The housing 911 includes a power button 916, operation keys 917, a speaker 918, and the like. A board on which an electronic component including the semiconductor device described in the above embodiment is provided is mounted on at least one of the housings 911 and 912. Thus, an e-book reader that consumes less power and has improved convenience is obtained.

Figure 18C:
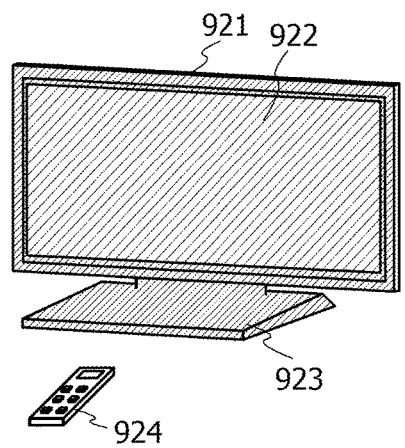

FIG. 18C is a television device, which includes a housing 921, a display portion 922, a stand 923, and the like. The television device 920 can be operated with a switch of the housing 921 and a remote control 924. A board on which an electronic component including the semiconductor device described in the above embodiment is provided is mounted on the housing 921 and the remote control 924. Thus, a television device that consumes less power and has improved convenience is obtained.

Figure 18D:
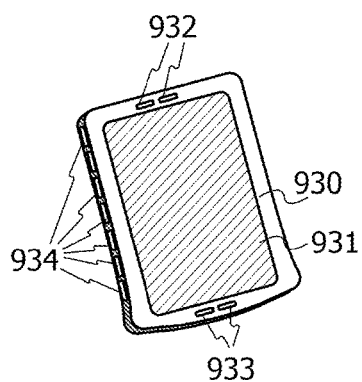

FIG. 18D illustrates a smartphone in which a main body 930 includes a display portion 931, a speaker 932, a microphone 933, operation buttons 934, and the like. A board on which an electronic component including the semiconductor device described in the above embodiment is provided is mounted on the main body 930. Thus, a smartphone that consumes less power and has improved convenience is obtained.

Figure 18E:
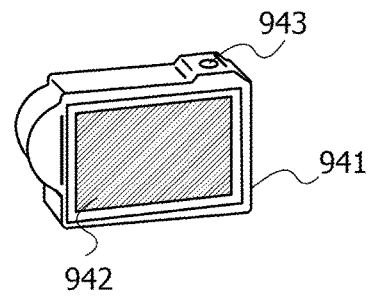

FIG. 18E illustrates a digital camera, which includes a main body 941, a display portion 942, an operation switch 943, and the like. A board on which an electronic component including the semiconductor device described in the above embodiment is provided is mounted on the main body 941. Thus, a digital camera that consumes less power and has improved convenience is obtained.

As described above, a broad on which an electronic component including the semiconductor device described in the above embodiment is provided is mounted on each of the electronic devices described in this embodiment. Thus, an electronic device that consumes less power and has improved convenience is obtained.

This application is based on Japanese Patent Application serial No. 2013-093142 filed with Japan Patent Office on Apr. 26, 2013, the entire contents of which are hereby incorporated by reference.

What is claimed is:

1. A semiconductor device comprising:
an instruction decoder configured to receive instructions from an instruction cache;
a logic circuit comprising a volatile register and a nonvolatile register, the logic circuit configured to execute an instruction of the instructions transmitted from the instruction decoder;
a backup need determination circuit configured to determine a data backup-free address of the logic circuit based on an operand and an opcode of an unexecuted instruction of the instructions transmitted from the instruction decoder; and
a power gating control circuit configured to control power supply to the logic circuit and data backup from the volatile register to the nonvolatile register in accordance with the data backup-free address,
wherein the data backup-free address is an address which does not need the data backup from the volatile register to the nonvolatile register.

2. The semiconductor device according to claim 1, wherein the instruction decoder comprises:
a decoder configured to decode the instructions;
an instruction counter configured to hold a count value for transmitting the instructions from the instruction decoder to the logic circuit, the decoder configured to increment the count value; and
an instruction readout circuit configured to transmit the operand and the opcode from the decoder to the backup need determination circuit in accordance with the count value after a power-off request signal is input to the instruction decoder.

3. The semiconductor device according to claim 1, wherein the backup need determination circuit comprises:
an address determination circuit configured to determine whether the operand is a destination address or a source address in accordance with the opcode, and
a backup-free address determination circuit comprising:
a comparison circuit configured to compare the destination address with the source address and transmit the destination address when the destination address does not agree with the source address to the power gating control circuit as the data backup-free address.

4. The semiconductor device according to claim 1, wherein the power gating control circuit comprises:
a backup-free address register configured to store the data backup-free address; and
a backup/recovery control circuit configured to control the data backup in accordance with the data backup-free address.

5. The semiconductor device according to claim 1, wherein the backup need determination circuit comprises:
a backup-free address determination circuit configured to transmit the data backup-free address in accordance with the instruction address to the power gating control circuit.

6. The semiconductor device according to claim 1, wherein the nonvolatile register comprises a transistor including an oxide semiconductor layer.

7. A semiconductor device comprising:
an instruction decoder configured to receive instructions from an instruction cache;
a logic circuit comprising a volatile register and a nonvolatile register, the logic circuit configured to execute an instruction of the instructions transmitted from the instruction decoder;
a backup need determination circuit configured to determine a data backup-free address of the logic circuit based on an operand and an opcode of an unexecuted instruction of the instructions transmitted from the instruction decoder; and
a power gating control circuit configured to control power supply to the logic circuit and data backup from the volatile register to the nonvolatile register in accordance with the data backup-free address,
wherein the power gating control circuit is configured not to back up data of the data backup-free address.

8. The semiconductor device according to claim 7, wherein the instruction decoder comprises:
a decoder configured to decode the instructions;
an instruction counter configured to hold a count value for transmitting the instructions from the instruction decoder to the logic circuit, the decoder configured to increment the count value; and
an instruction readout circuit configured to transmit the operand and the opcode from the decoder to the backup need determination circuit in accordance with the count value after a power-off request signal is input to the instruction decoder.

9. The semiconductor device according to claim 7,
wherein the backup need determination circuit comprises:
an address determination circuit configured to determine whether the operand is a destination address or a source address in accordance with the opcode, and
a backup-free address determination circuit comprising:
a comparison circuit configured to compare the destination address with the source address and transmit the destination address when the destination address does not agree with the source address to the power gating control circuit as the data backup-free address.

10. The semiconductor device according to claim 7,
wherein the power gating control circuit comprises:
a backup-free address register configured to store the data backup-free address; and
a backup/recovery control circuit configured to control the data backup in accordance with the data backup-free address.

11. The semiconductor device according to claim 7,
wherein the backup need determination circuit comprises:
a backup-free address determination circuit configured to transmit the data backup-free address in accordance with the instruction address to the power gating control circuit.

12. The semiconductor device according to claim 7, wherein the nonvolatile register comprises a transistor including an oxide semiconductor layer.

13. A method for driving a semiconductor device comprising:
decoding instructions transmitted from an instruction cache to an instruction decoder;
transmitting a first instruction of the instructions from the instruction decoder to a logic circuit;
executing the first instruction in the logic circuit;
transmitting an operand and an opcode of a second instruction of the instructions from the instruction decoder to a backup need determination circuit after a power-off request signal is input to the instruction decoder;
determining a data backup-free address of the logic circuit based on the operand and the opcode in the backup need determination circuit;
transmitting the data backup-free address from the backup need determination circuit to a power gating control circuit;
controlling data backup from a volatile register to a nonvolatile register in the logic circuit by the power gating control circuit in accordance with the data backup-free address; and
stopping power supply to the logic circuit after the data backup;
wherein data of the data backup-free address is not backed up.

14. The method according to claim 13, further comprising:
starting the power supply to the logic circuit after stopping the power supply;
recovering the data from the nonvolatile register to the volatile register;
transmitting the second instruction of the instructions from the instruction decoder to the logic circuit after recovering the data; and
executing the second instruction in the logic circuit.

15. The method according to claim 13, further comprising:
determining whether the operand is a destination address or a source address in accordance with the opcode, and
comparing the destination address with the source address and transmit the destination address when the destination address does not agree with the source address to the power gating control circuit as the data backup-free address.

16. The method according to claim 13, further comprising:
providing the instructions with the instruction address in the instruction decoder; and
transmitting an address of the second instruction of the instructions in accordance with the instruction address to the power gating control circuit as the data backup-free address.

17. The method according to claim 13, wherein the nonvolatile register comprises a transistor including an oxide semiconductor layer.

* * * * *